US007107512B2

(12) United States Patent
Cameron

(10) Patent No.: US 7,107,512 B2
(45) Date of Patent: Sep. 12, 2006

(54) TTCM DECODER DESIGN

(75) Inventor: Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 528 days.

(21) Appl. No.: 10/444,148

(22) Filed: May 22, 2003

(65) Prior Publication Data

US 2003/0226097 A1 Dec. 4, 2003

Related U.S. Application Data

(60) Provisional application No. 60/384,698, filed on May 31, 2002, provisional application No. 60/434,734, filed on Dec. 18, 2002.

(51) Int. Cl.
*H03M 13/03* (2006.01)
(52) U.S. Cl. ...................... 714/794; 714/795
(58) Field of Classification Search ............... 714/794, 714/795
See application file for complete search history.

(56) References Cited

U.S. PATENT DOCUMENTS

| | | | |
|---|---|---|---|
| 5,406,570 A | 4/1995 | Berrou et al. | |
| 5,446,747 A | 8/1995 | Berrou | |
| 5,563,897 A | 10/1996 | Pyndiah et al. | |
| 6,028,899 A * | 2/2000 | Petersen | 375/341 |
| 6,065,147 A | 5/2000 | Pyndiah et al. | |

(Continued)

FOREIGN PATENT DOCUMENTS

EP 0 735 696 A2 10/1996

(Continued)

OTHER PUBLICATIONS

Raouafi et al: "Saving memory in turbo-decoders using the Max-Log-MAP algorithm" IEE Colloquium, Turbo Codes in Digital Broadcasting-Could it be Double Capacity, XX, XX, Nov. 22, 1999, pp. 14/1-14/4, XP002185687 pp. 14-2; figure 2.

(Continued)

*Primary Examiner*—Joseph Torres
(74) *Attorney, Agent, or Firm*—Garlick, Harrison & Markison; Shayne X. Short

(57) ABSTRACT

TTCM (Turbo Trellis Coded Modulation) decoder design. The design also adapts to any number of devices that perform decoding of Trellis Code Modulation (TCM) signals. After performing initial symbol processing within a data block to generate a number of check point values, the design selectively re-calculates some forward metrics (alphas) and backward metrics (betas), and the design is able to calculate extrinsic (ext) information for each symbol within the data block successively. The data block is sub-divided into a number of sub-blocks that are intelligently processed to enable extremely fast processing. Generally speaking, the design performs initial processing starting from both block ends, and upon approaching the block middle, the design begins to process the block using skip backs to previous sub-blocks. The design employs a great deal of parallel and simultaneously processing to provide for very fast computation of the various values required to decode the block.

30 Claims, 23 Drawing Sheets

(56) References Cited

U.S. PATENT DOCUMENTS

| | | | |
|---|---|---|---|
| 6,119,264 A | 9/2000 | Berrou et al. | |
| 6,122,763 A | 9/2000 | Pyndiah et al. | |
| 6,343,368 B1 * | 1/2002 | Lerzer | 714/796 |
| 6,484,283 B1 * | 11/2002 | Stephen et al. | 714/786 |
| 6,530,059 B1 * | 3/2003 | Crozier et al. | 714/786 |
| 6,598,204 B1 * | 7/2003 | Giese et al. | 714/795 |
| 6,857,101 B1 * | 2/2005 | Levy | 714/796 |
| 2002/0021770 A1 * | 2/2002 | Beerel et al. | 375/340 |

FOREIGN PATENT DOCUMENTS

| | | |
|---|---|---|
| EP | 0 735 696 A3 | 1/1999 |
| EP | 1 156 588 A1 | 1/1999 |
| FR | 91 05278 A1 | 10/1992 |
| WO | WO 02 23739 A2 | 3/2002 |

OTHER PUBLICATIONS

Schurgers C et al: "Optimized map turbo decoder" Proc. of IEEE Workshop on Signal Processing Systems SIPS 2000, Oct. 11, 2000, pp. 245-254, XP010525234 p. 248-249; figures 3, 4.

Akella R et al: "On the parallel map algorithm" Proc. of IEEE Workshop on Multimedia Signal Processing, Oct. 3, 2001, pp. 371-376, XP010565802 Cannes, France, the whole document.

* cited by examiner

High Definition Television (HDTV) communication system

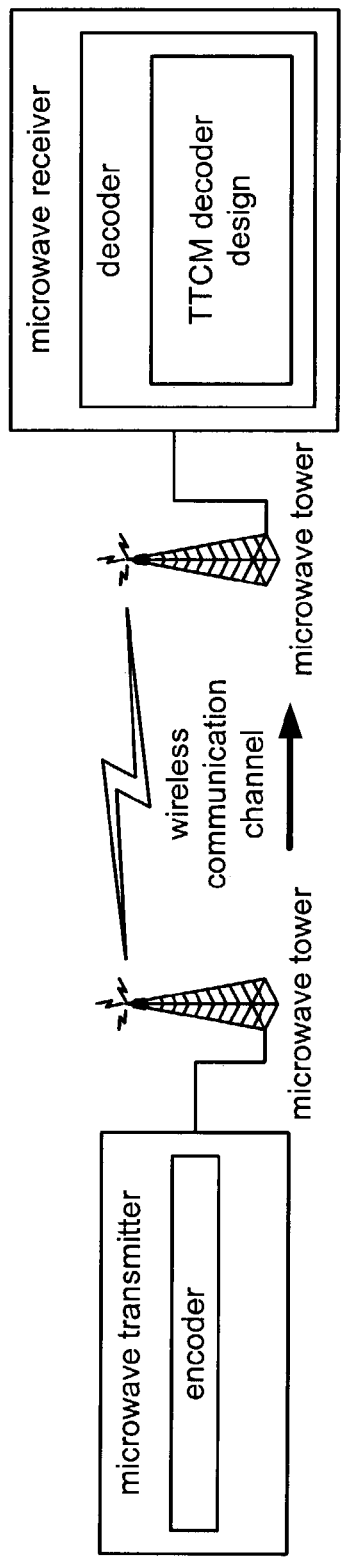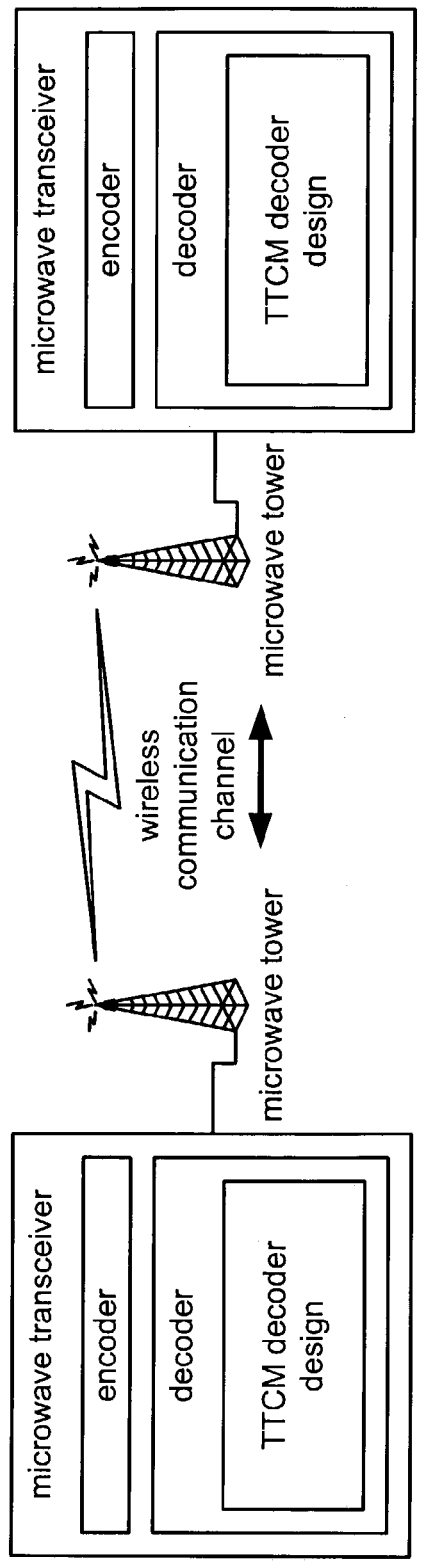

uni-directional point-to-point radio communication system bi-directional point-to-point radio communication system fiber-optic communication system satellite receiver set-top box system TTCM decoder design I,Q extraction alternative TTCM decoder design (shown as receiving I,Q inputs) that recycles single SISO symbols passed for metric calculation (using 8 symbol embodiment)

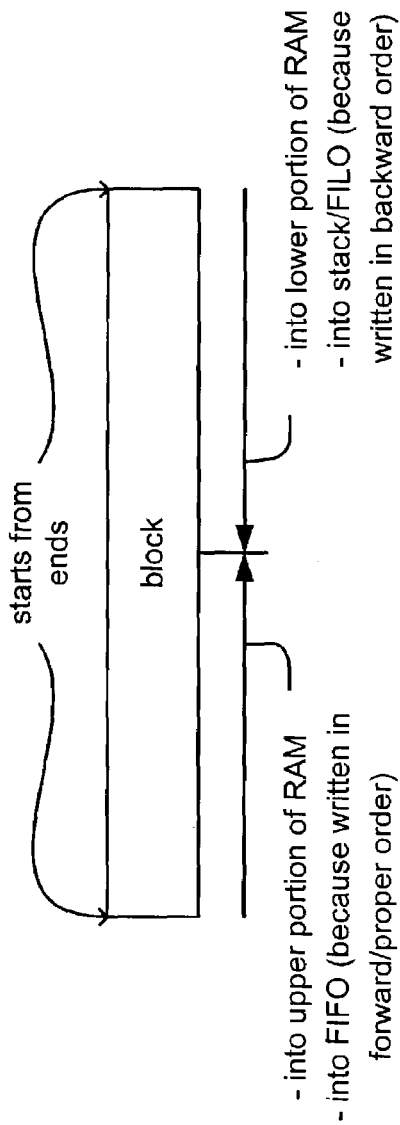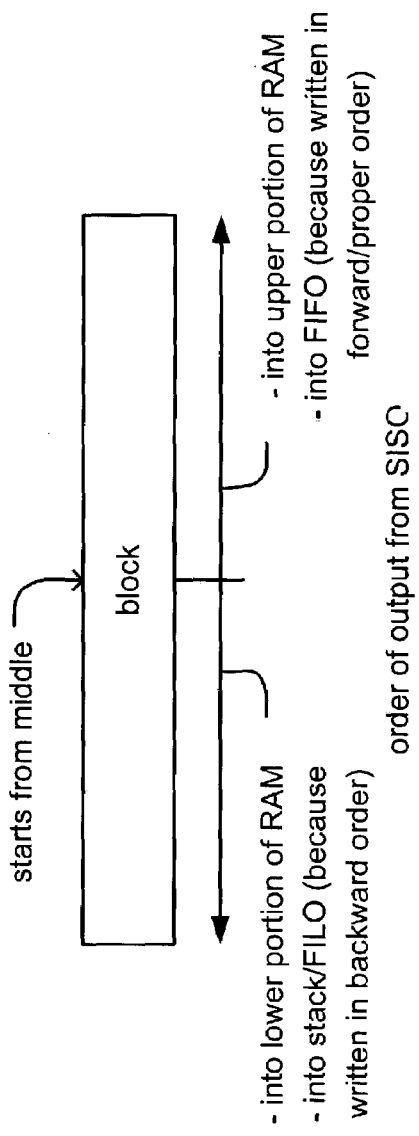
Fig. 15A
Fig. 15B final output of decoding

SISO received block processing functionality

SISO functional block arrangement address generation for interleaver/de-interleaver functional block counter usage within block processing (shown in 128 symbol sub-block embodiment)

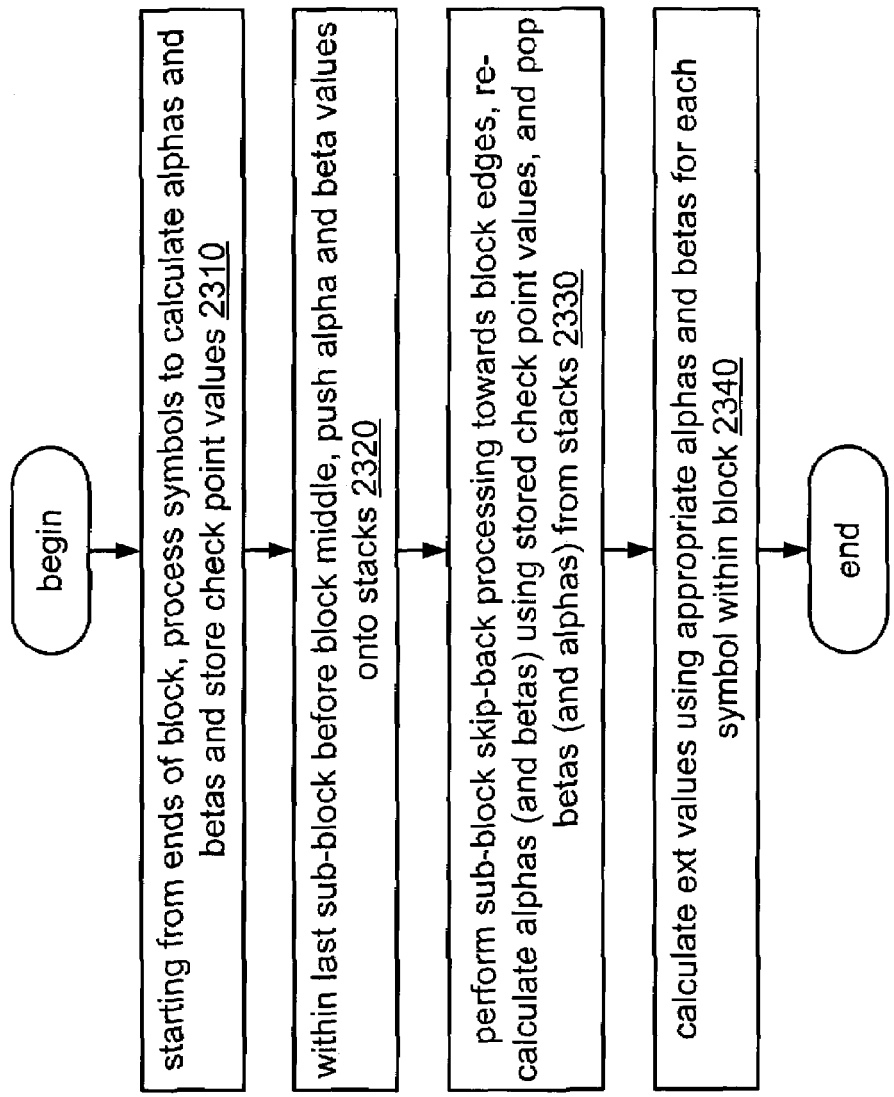

TTCM DECODER DESIGN

CROSS REFERENCE TO RELATED PATENTS/PATENT APPLICATIONS

"The following U.S. Provisional Patent Applications is hereby incorporated herein by reference in their entirety and made part of the present U.S. Utility patent application for all purposes:"

1. U.S. Provisional Patent Application Ser. No. 60/384,698, entitled "Variable code rate and signal constellation turbo trellis coded modulation codec," filed May 31, 2002, pending.

2. U.S. Provisional Application Ser. No. 60/434,734, "TTCM decoder design," filed Dec. 18, 2002, pending.

The present U.S. Utility patent application also claims priority pursuant to 35 U.S.C. §120 to the following U.S. Utility patent application which is hereby incorporated herein by reference in its entirety and made part of the present U.S. Utility patent application for all purposes:

1. U.S. Utility application Ser. No. 10/264,486, entitled "Variable code rate and signal constellation turbo trellis coded modulation codec," filed Oct. 4, 2002, pending.

BACKGROUND OF THE INVENTION

1. Technical Field of the Invention

The invention relates generally to communication systems; and, more particularly, it relates to decoding of encoded signals within such communication systems.

2. Description of Related Art

Data communication systems have been under continual development for many years. One such type of communication system that has been of significant interest lately is a communication system that employs turbo codes. Another type of communication system that has also received interest is a communication system that employs Low Density Parity Check (LDPC) code. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular Signal to Noise Ratio (SNR), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB from the theoretical Shannon limit. While this example was achieved using an irregular LDPC code of a length of one million, it nevertheless demonstrates the very promising application of LDPC codes within communication systems.

In performing calculations when decoding a received signal, it is common for decoders to perform determination of a largest (using a max calculation or a max operation) and/or a smallest (using a min calculation or a min operation) to determine a largest or smallest value from among a number of values. This processing is oftentimes common in performing calculations of state metrics within soft-in soft-out functional block (SISO) decoders. For example, several state metrics are calculated, and the smallest and/or largest state metric is determined to be the proper state metric. Depending upon the decision criteria, the largest and/or smallest state metric may be determined to be the "proper" state metric.

In performing calculations when decoding a received signal, it is also common for decoders to operate in the natural log (ln) domain when performing various calculations. Many turbo code decoders fall into this category, and many LDPC decoders also fall in to this category as well. By operating within the natural log (ln) domain, this converts all multiplications to additions, divisions to subtractions, and eliminates exponentials entirely, without affecting Bit Error Rate (BER) performance. While this approach represents one such way in which some of the difficult processing steps required to decode signals received within such communication systems, they are focused on addressing just one aspect of the decoding difficulties.

Another processing challenge in the decoding of such signals received within communication systems is the management of the very data itself. The memory management required to perform proper decoding of such signals can also be very burdensome. Oftentimes, in prior art systems, it is the management of the data within the decoding of received data that presents one of the largest bottlenecks in the system.

FIG. 1 is a diagram illustrating one prior art approach to received block processing. Initially, forward metrics (alphas) are sequentially calculated for each symbol within the received block in one direction. Then, backward metrics (alphas) are sequentially calculated for each symbol within the received block in the opposite direction. After the alphas and betas have been determined for each symbol within the block, then extrinsic (ext) information may be calculated there from to proceed in the final decoding of the received symbols within the block. There are a number of apparent disadvantages to this prior art approach to received block processing. Some of the disadvantages include that it requires a lot of real estate to support the extensive memory that must be provisioned to enable such an approach. Within many communication systems, including those employing TCM, there are a number of intermediate calculations that must be performed (e.g., the alpha and beta calculations that precede the ext calculations) and these intermediate values must be stored for subsequent use in the prior art approach.

Another disadvantage, inherently coupled to the disadvantage of requiring a large amount of memory, is that there is a large amount of read/write (r/w) operations that must be performed to support this processing. The memory management performed herein is typically quite overburdened. In addition, the computation can be very slow, in that, a large number of intermediate calculations must be performed to support the decoding of data within this prior art approach. It is also noted that as the block size continues to increase, this prior art simply becomes more and more difficult to implement. It is clear that as the block size increases, the memory required, the r/with operations, and the memory required will be scaled accordingly.

There exists a need in the art to provide for a much more efficient approach to processing a received block of data that would address any of the deficiencies described above within the prior art approach of sequential processing to generate the necessary intermediate and final calculations required to decoded the received block. In addition, it would be desirable that such a design be scalable and able to accommodate larger and/or smaller blocks as implemented within various types of corn systems.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 5A is a system diagram illustrating an embodiment of a uni-directional microwave communication system that is built according to the invention.

FIG. 5B is a system diagram illustrating an embodiment of a bi-directional microwave communication system that is built according to the invention.

FIG. 15A is a diagram illustrating an embodiment of the order of output from a metric generator according to the invention (which is the same order of output from an interleaver/de-interleaver according to the invention).

FIG. 15B is a diagram illustrating an embodiment of the order of output from a SISO (soft-in soft-out functional block) according to the invention.

FIG. 23 is a flowchart illustrating an embodiment of a received block processing method that is performed according to the invention.

DETAILED DESCRIPTION OF THE INVENTION

Figure 1:
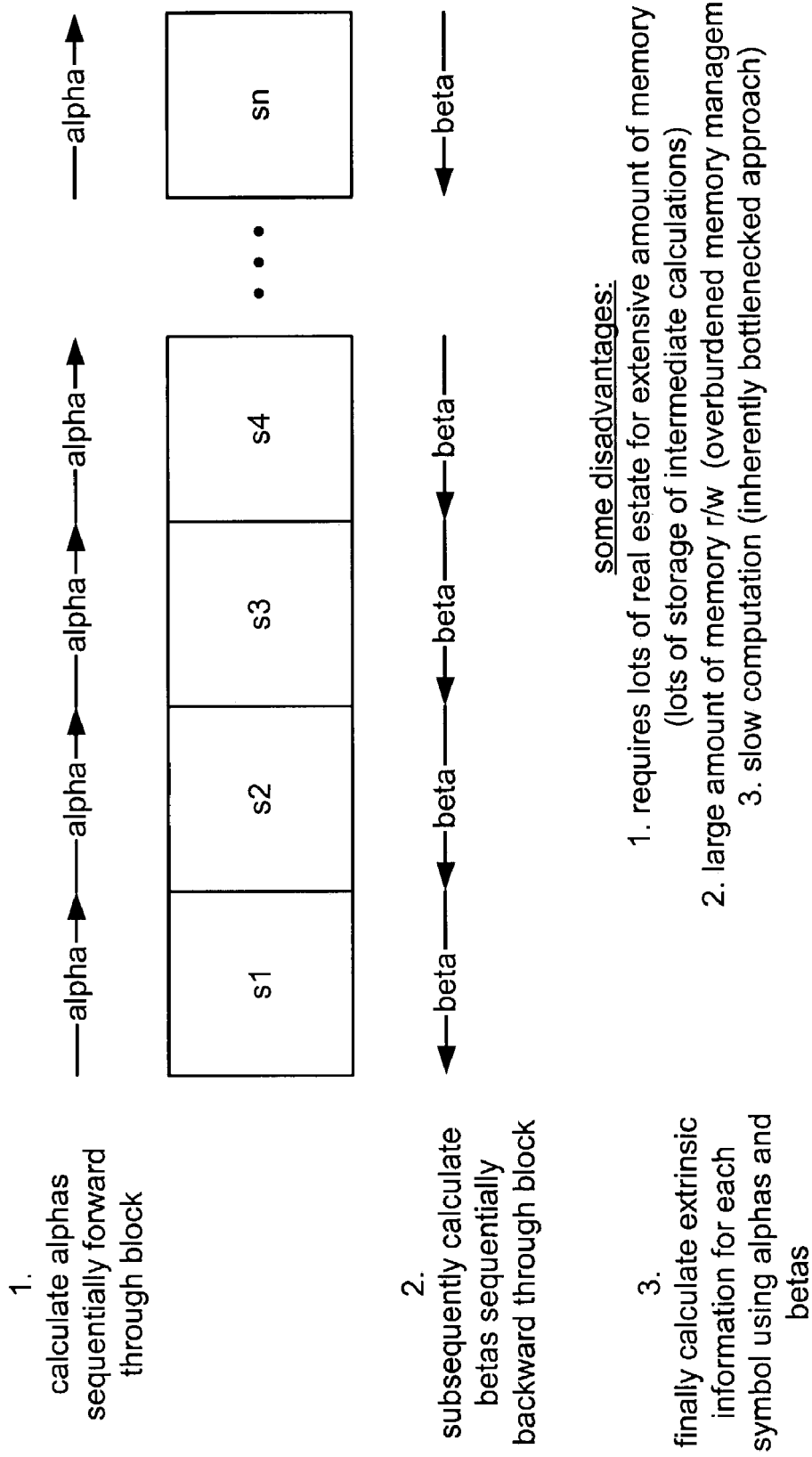
FIG. 1 is a diagram illustrating one prior art approach to received block processing.

The invention involves several aspects of a novel and very efficient decoder design that is, in one embodiment, tailored for use in decoding signals encoded using TTCM (Turbo Trellis Coded Modulation), PC-TCM (Parallel Concatenated Trellis Coded Modulation), and/or Trellis Code Modulation (TCM). The invention employs a design that is readily adaptable to support decoding of signals that may vary on a symbol by symbol basis of having variable code rates, variable modulation types, various constellation shapes and/or variable mappings for those constellation shapes as well. The invention performs intelligent reordering and manipulation of the individual symbols of a received block that allows for very fast processing as well as relatively minimal amounts of hardware required in the implementation (memory, registers, etc.).

Generally speaking, the invention processes a received block by initially performing symbol processing within the block to generate a number of check point values for selected sub-blocks. The processing begins calculation for forward metrics (alphas) beginning at one end of the block and working toward the block middle and backward metrics (betas) beginning at the other end of the block and working toward the block middle. The invention pushes check point values, associated with the sub-blocks onto a check point stack, in one embodiment. These check point values indicate the initial conditions that may be later used to re-calculate the appropriate alphas and betas, respectively, within these sub-blocks. Initially, only the check point values are stored during the initial processing that processed the block beginning from both ends and working towards the block middle. After reaching the sub-blocks adjacent to the block middle, the processing then calculates and stores each of the alphas for the sub-block on one side of the block middle and each of the betas for the sub-block on other side of the block middle. The storing of the alphas and betas may be performed using alpha/beta stacks according to the invention. Stacks may also be referred to as First In-Last Out (FILO) storage devices where elements are pushed and popped there from; the last element pushed (written/stored) onto the stack/FILO will then be first element popped (read/retrieved) there from.

After the processing reaches the block middle, the processing according to the invention is able to provide extrinsic information for each and every symbol successively beginning from the block middle and extending out towards the two block ends. The corresponding alpha that has been stored each symbol of the sub-block on the one side of the block middle, as described above in the initial processing, is retrieved as the corresponding beta for each respective symbol is calculated. The associated retrieved alpha and just calculated beta may then be used immediately to calculate the extrinsic information associated with each symbol within this sub-block. Similarly, the corresponding beta that has been stored each symbol of the sub-block on the other side of the block middle, as described above in the initial processing, is retrieved as the corresponding alpha for each respective symbol is calculated. The associated retrieved beta and just calculated alpha may then be used immediately to calculate the extrinsic information associated with each symbol within this sub-block. Simultaneously, the invention performs skip-back processing to re-calculate the respective alphas and betas for each of the preceding sub-blocks in both directions extending from the block middle to the two block ends. This parallel and simultaneously calculation provides for very fast and efficient processing of the entire block.

This skip-back processing, performed simultaneously with the popping of the appropriate alphas/betas, allows for calculation of the extrinsic values of each of the symbols of the block to be calculated successively beginning from the block middle and extending simultaneously in both directions towards the two block ends.

To enable this type of processing, the block of data is sub-divided into a number of sub-blocks that are intelligently processed to enable extremely fast processing. Generally speaking, the design performs initial processing starting from both block ends, and upon approaching the block middle, the design begins to process the block using skip backs to previous sub-blocks. The design employs a great deal of parallel and simultaneously processing to provide for very fast computation of the various values required to decode the block.

Figure 2:
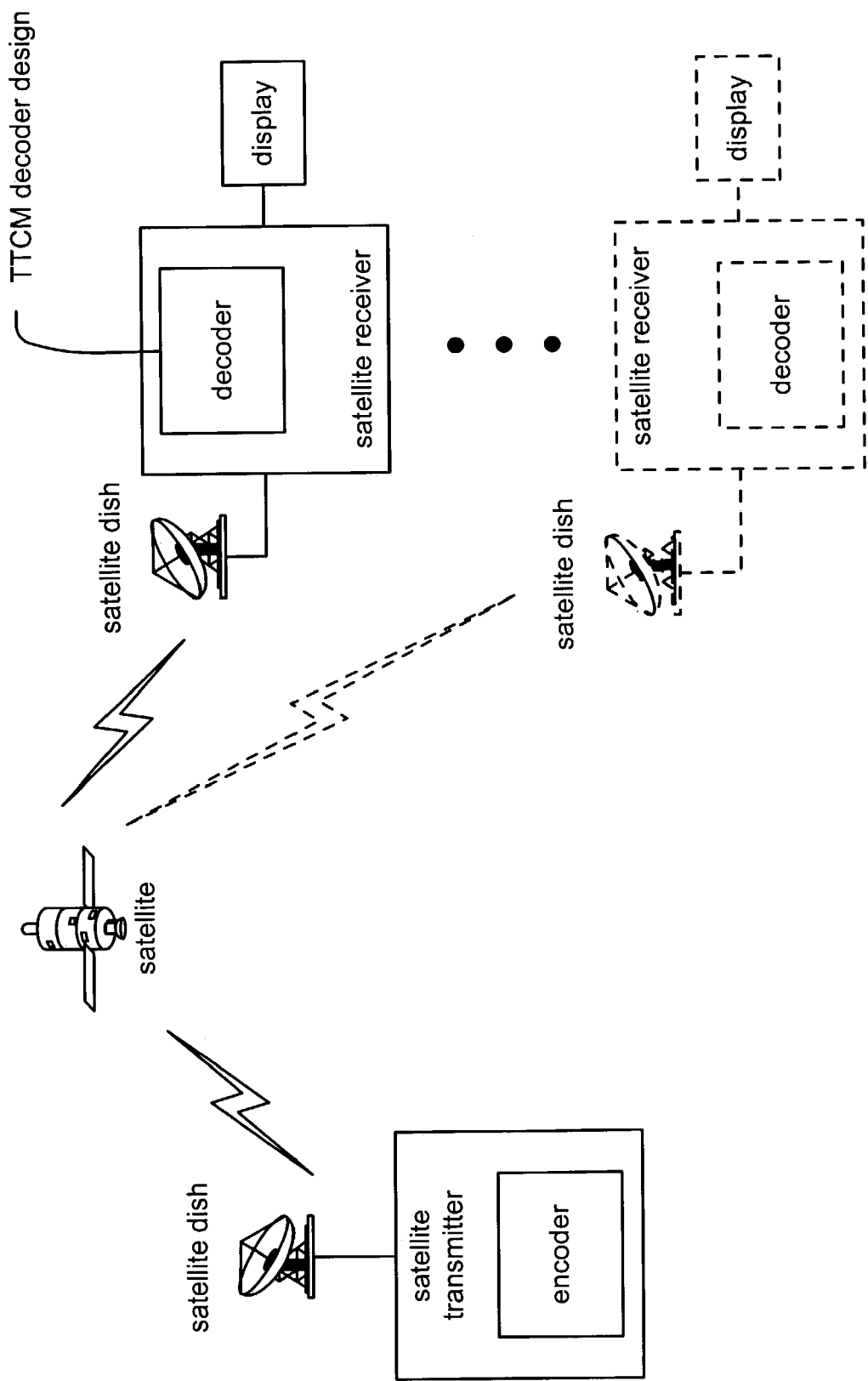
FIG. 2 is a system diagram illustrating an embodiment of a satellite communication system that is built according to the invention.

FIG. 2 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, and/or other wired networks. The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite shown. In this case, each leg of an up-down transmission via the wireless communication channel may be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) that is to be transmitted to the satellite receiver; the satellite receiver is operable to decode the transmitted signal (using a decoder). Any one or more of the decoders implemented within the satellite receivers may be implemented to support the TTCM decoder design of the invention. The FIG. 2 shows just one of the many embodiments where a decoder may be implemented according to the invention.

Figure 3:
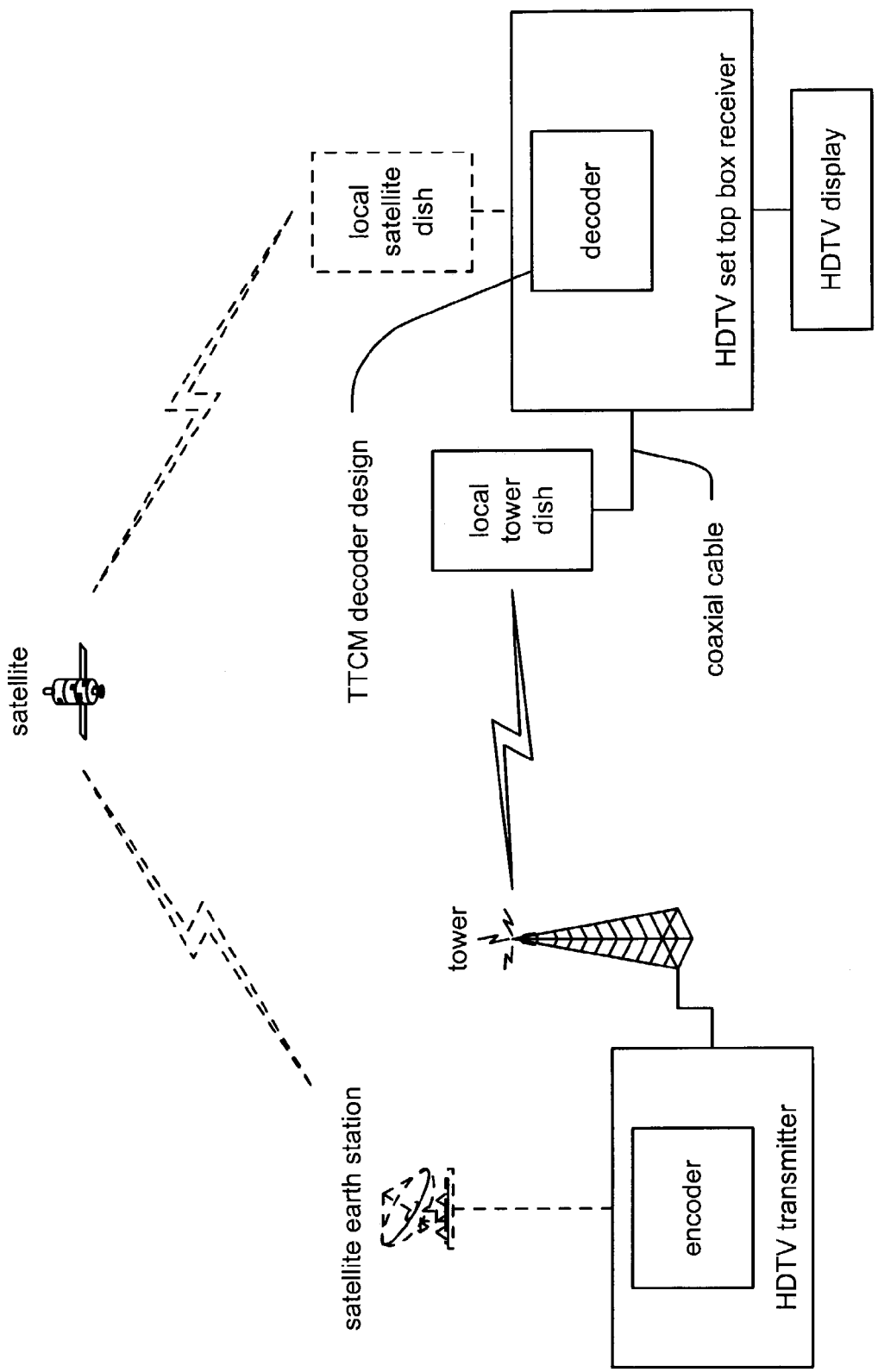
FIG. 3 is a system diagram illustrating an embodiment of a High Definition Television (HDTV) communication system that is built according to the invention.

FIG. 3 is a system diagram illustrating an embodiment of a High Definition Television (HDTV) communication system that is built according to the invention. An HDTV transmitter is communicatively coupled to a tower. The HDTV transmitter, using its tower, transmits a signal to a local tower dish via a wireless communication channel. The local tower dish communicatively couples to an HDTV set top box receiver via a coaxial cable or some other communication means. The HDTV set top box receiver includes the functionality to receive the wireless transmitted signal that has been received by the local tower dish; this may include any transformation and/or down-converting that may be needed to accommodate any up-converting that may have been performed before and during transmission of the signal from the HDTV transmitter and its tower. Some example may include transforming down to intermediate frequencies (IFs) and then down to baseband (BB) and/or directly converting down to BB in other embodiments.

The HDTV set top box receiver is also communicatively coupled to an HDTV display that is able to display the demodulated and decoded wireless transmitted signals received by the HDTV set top box receiver and its local tower dish. The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is destined for the HDTV set top box receiver. For example, another satellite earth station may first transmit a signal to the satellite from another location, and the satellite may relay this signal to the satellite earth station that is communicatively coupled to the HDTV transmitter. The HDTV transmitter performs receiver functionality and then transmits its received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV set top box receiver via a coaxial cable. This path of transmission shows yet another communication path where the HDTV set top box receiver may communicate with the HDTV transmitter.

In whichever embodiment and whichever signal path the HDTV transmitter employs to communicate with the HDTV set top box receiver, the HDTV set top box receiver is operable to receive communication transmissions from the HDTV transmitter.

The HDTV transmitter is operable to encode information (using an encoder) that is to be transmitted to the HDTV set top box receiver; the HDTV set top box receiver is operable to decode the transmitted signal (using a decoder). The decoder that may be implemented within the HDTV set top box receiver to support the TTCM decoder design of the invention. The FIG. 3 shows just one of the many embodiments where a decoder may be implemented according to the invention.

Figure 4A:
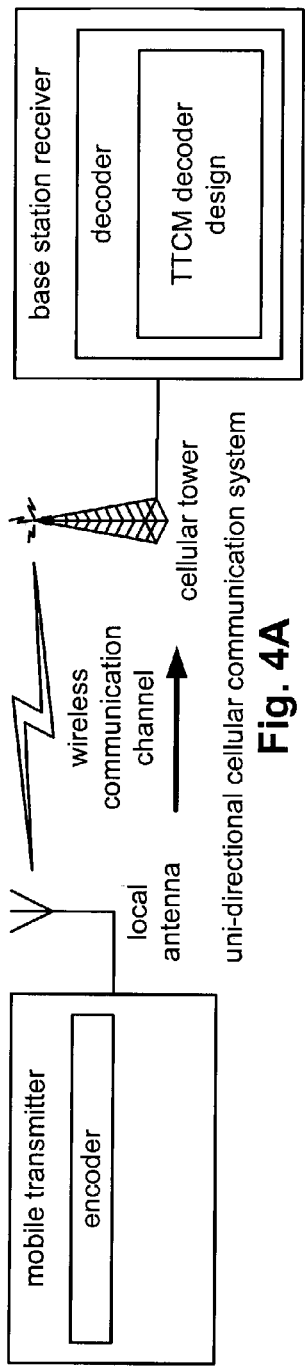
FIG. 4A and FIG. 4B are system diagrams illustrating embodiments of unidirectional cellular communication systems that are built according to the invention.
Figure 4B:
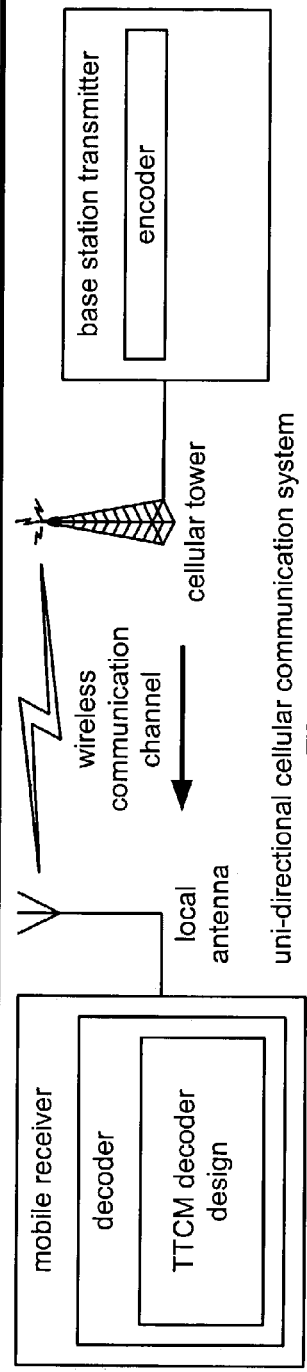

FIG. 4A and FIG. 4B are system diagrams illustrating embodiments of unidirectional cellular communication systems that are built according to the invention.

Referring to the FIG. 4A, a mobile transmitter includes a local antenna communicatively coupled thereto. The mobile transmitter may be any number of types of transmitters including a one way cellular telephone, a wireless pager unit, a mobile computer having transmit functionality, and/or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) that is to be transmitted to the base station receiver; the base station receiver is operable to decode the transmitted signal (using a decoder). The decoder may be implemented within the base station receiver to support the TTCM decoder design of the invention. The FIG. 4A shows yet another of the many embodiments where a decoder may be implemented according to the invention. The FIG. 4A shows a unidirectional cellular communication system where the communication goes from the mobile transmitter to the base station receiver via the wireless communication channel.

Referring to the FIG. 4B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) that is to be transmitted to the mobile receiver; the mobile receiver is operable to decode the transmitted signal (using a decoder). The decoder may be implemented within the mobile receiver to support the TTCM decoder design of the invention. The FIG. 4B shows yet another of the many embodiments where a decoder may be implemented according to the invention. The FIG. 4B shows a uni-directional cellular communication system where the communication goes from the base station transmitter to the mobile receiver via the wireless communication channel.

Figure 4C:
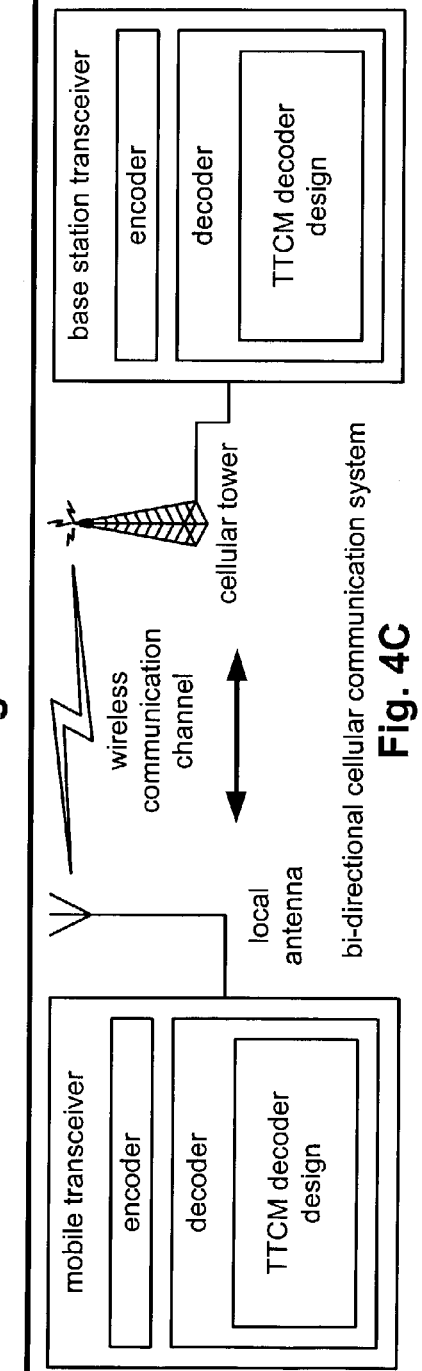
FIG. 4C is a system diagram illustrating embodiment of a bi-directional cellular communication system that is built according to the invention.

The FIG. 4C shows a bi-directional cellular communication system where the communication can go to and from the base station transceiver and to and from the mobile transceiver via the wireless communication channel.

Referring to the FIG. 4C, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceiver including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using an encoder) that is to be transmitted to the mobile transceiver; the mobile transceiver is operable to decode the transmitted signal (using a decoder). The decoder that may be implemented within either one of the mobile transceiver and the base station transceiver may be implemented as to support the TTCM decoder design of the invention. The FIG. 4C shows yet another of the many embodiments where a decoder may be implemented according to the invention.

FIG. 5A is a system diagram illustrating an embodiment of a uni-directional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) that is to be transmitted to the microwave receiver; the microwave receiver is operable to decode the transmitted signal (using a decoder). The decoder may be implemented within the microwave receiver to support the TTCM decoder design of the invention. The FIG. 5A shows yet another of the many embodiments where a decoder may be implemented according to the invention. The FIG. 5A shows a unidirectional microwave communication system where the communication goes from the microwave transmitter to the microwave receiver via the wireless communication channel.

FIG. 5B is a system diagram illustrating an embodiment of a bi-directional microwave communication system that is built according to the invention. Within the FIG. 5B, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using an encoder) that is to be transmitted to the other microwave transceiver; each microwave transceiver is operable to decode the transmitted signal (using a decoder) that it receives. Each of the microwave transceivers includes an encoder and a decoder. The decoder of either of the transceivers may be implemented to support the TTCM decoder design of the invention. The FIG. 5B shows yet another of the many embodiments where a decoder may be implemented according to the invention.

Figure 6A:
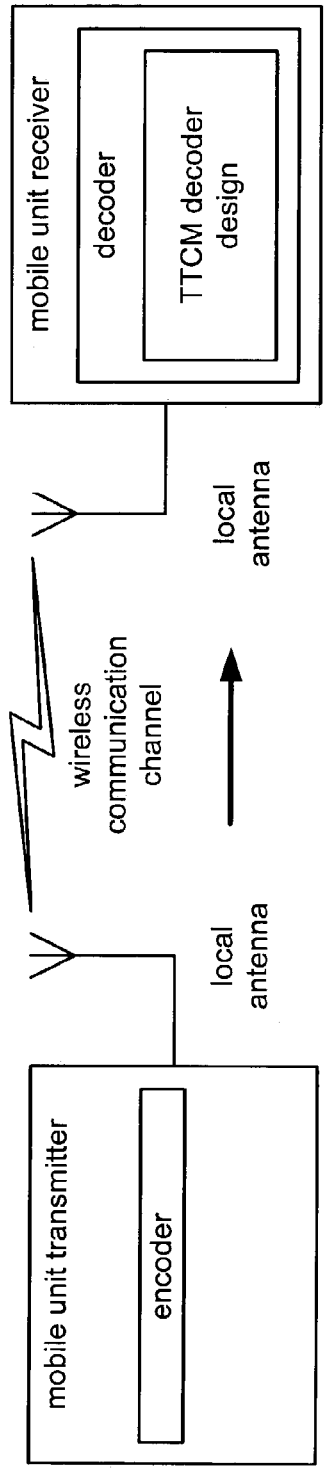
FIG. 6A is a system diagram illustrating an embodiment of a uni-directional point-to-point radio communication system that is built according to the invention.

FIG. 6A is a system diagram illustrating an embodiment of a uni-directional point-to-point radio communication system that is built according to the invention. A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) that is to be transmitted to the mobile unit receiver; the mobile unit receiver is operable to decode the transmitted signal (using a decoder). The decoder may be implemented within the mobile unit receiver to support the TTCM decoder design of the invention. The FIG. 6A shows yet another of the many embodiments where a decoder may be implemented according to the invention. The FIG. 6A shows a uni-directional communication system where the communication goes from the mobile unit transmitter to the mobile unit receiver via the wireless communication channel.

Figure 6B:
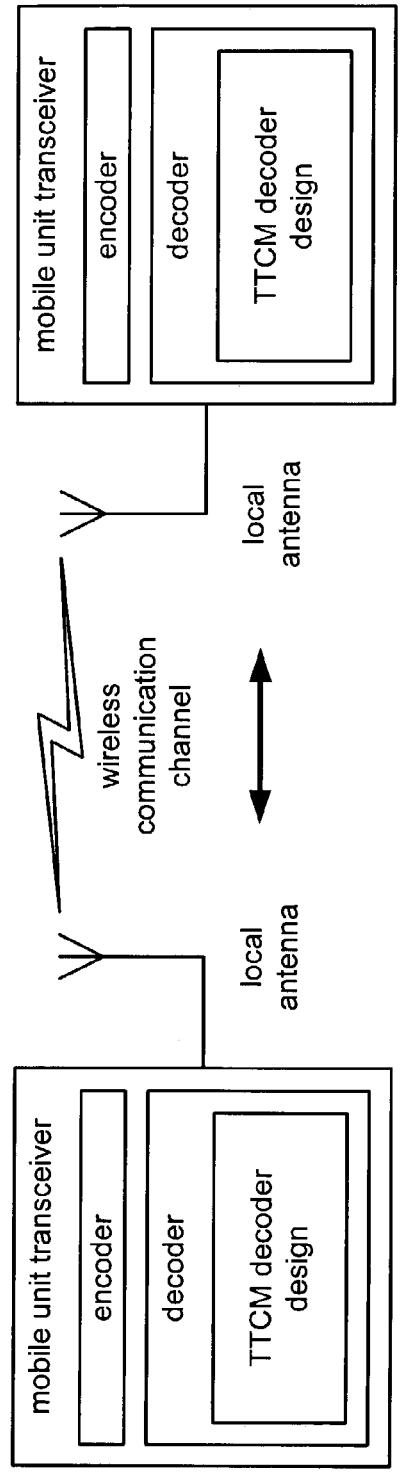
FIG. 6B is a system diagram illustrating an embodiment of a bi-directional point-to-point radio communication system that is built according to the invention.

FIG. 6B is a system diagram illustrating an embodiment of a bi-directional point-to-point radio communication system that is built according to the invention. Within the FIG. 6B, a first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each mobile unit transceiver is operable to encode information (using an encoder) that is to be transmitted to the other mobile unit transceiver; each mobile unit transceiver is operable to decode the transmitted signal (using a decoder) that it receives. The decoder of either of the mobile unit transceivers may be implemented to support the TTCM decoder design of the invention. The FIG. 6B shows yet another of the many embodiments where a decoder may be implemented according to the invention.

Figure 7A:
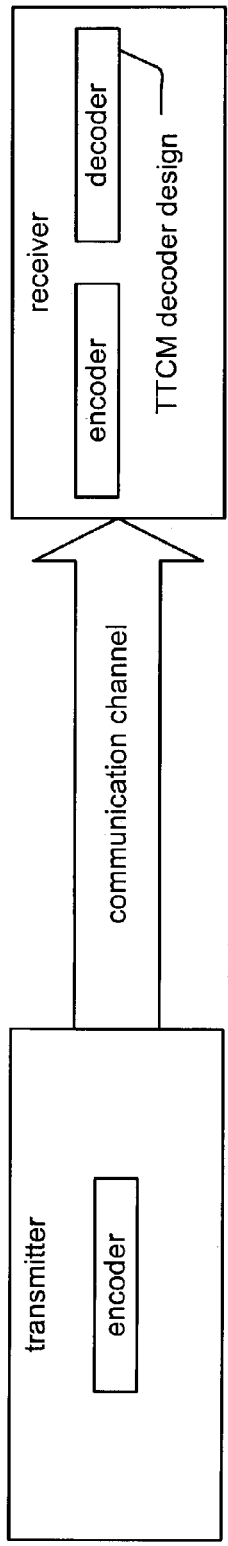
FIG. 7A is a system diagram illustrating an embodiment of a uni-directional communication system that is built according to the invention.

FIG. 7A is a system diagram illustrating an embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) that is to be transmitted to the receiver; the receiver is operable to decode the transmitted signal (using a decoder). The decoder may be implemented within the receiver to support the TTCM decoder design of the invention. The FIG. 7A shows yet another of the many embodiments where a decoder may be implemented according to the invention. The FIG. 7A shows a uni-directional communication system where the communication goes from the transmitter to the receiver via the communication channel.

Figure 7B:
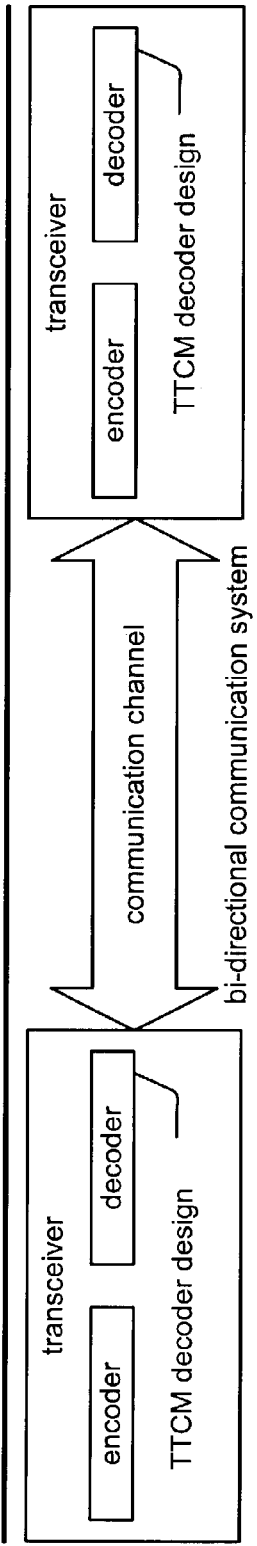
FIG. 7B is a system diagram illustrating an embodiment of a bi-directional communication system that is built according to the invention.

FIG. 7B is a system diagram illustrating an embodiment of a bi-directional communication system that is built according to the invention. Within the FIG. 7B, a first transceiver is communicatively coupled to a second transceiver via a bi-directional communication channel. The bi-directional communication channel may be a wireline (or wired) communication channel or a wireless communication channel without departing from the scope and spirit of the invention. The characteristics of the wired and/or wireless communication channel may be varied as also described above.

Each of the transceivers is operable to encode information (using an encoder) that is to be transmitted to the other transceiver; each transceiver is operable to decode the transmitted signal (using a decoder) that it receives. The decoder of either of the transceivers may be implemented to support the TTCM decoder design of the invention. The FIG. 7B shows yet another of the many embodiments where a decoder may be implemented according to the invention.

Figure 7C:
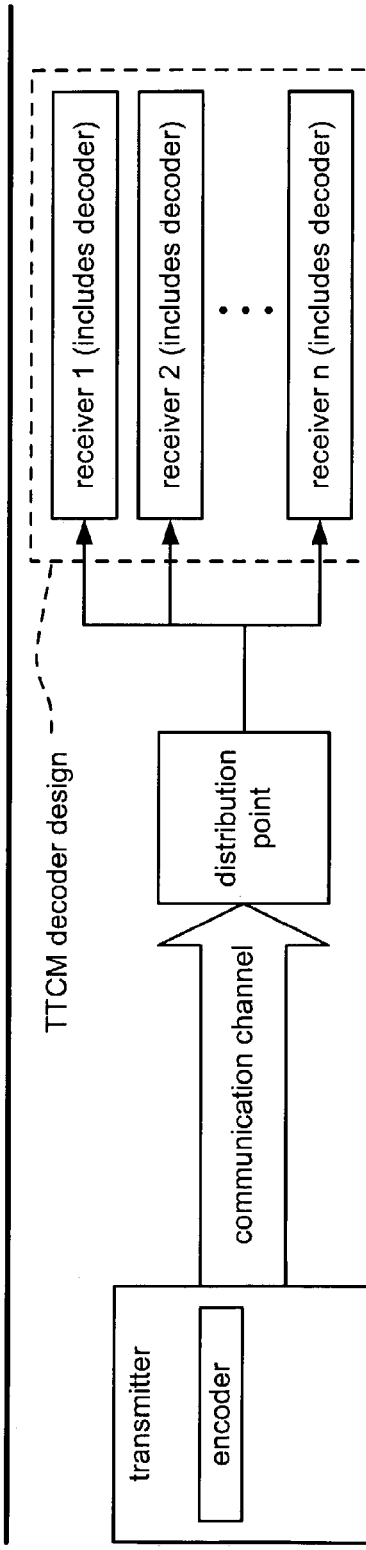
FIG. 7C is a system diagram illustrating an embodiment of a one to many communication system that is built according to the invention.

FIG. 7C is a system diagram illustrating embodiment of a one to many communication system that is built according to the invention. A transmitter is able to communicate, via broadcast in certain embodiments, with a number of receivers, shown as receivers 1, 2, . . . , n via a uni-directional communication channel. The unidirectional communication channel may be a wireline (or wired) communication channel or a wireless communication channel without departing from the scope and spirit of the invention. Again, the characteristics of the wired and/or wireless communication channel may be varied as also described above.

A distribution point is employed within the one to many communication system to provide the appropriate communication to the receivers 1, 2, . . . , and n. In certain embodiments, the receivers 1, 2, . . . , and n each receive the same communication and individually discern which portion of the total communication is intended for that particular receiver.

The transmitter is operable to encode information (using an encoder) that is to be transmitted to the receivers 1, 2, . . . , and n; each of the receivers 1, 2, . . . , and n is operable to decode the transmitted signal (using a decoder). The decoders within any one or all of the receivers 1, 2, . . . , and n may be implemented as to support the TTCM decoder design of the invention. The FIG. 7C shows yet another of the many embodiments where a decoder may be implemented according to the invention.

Figure 8:
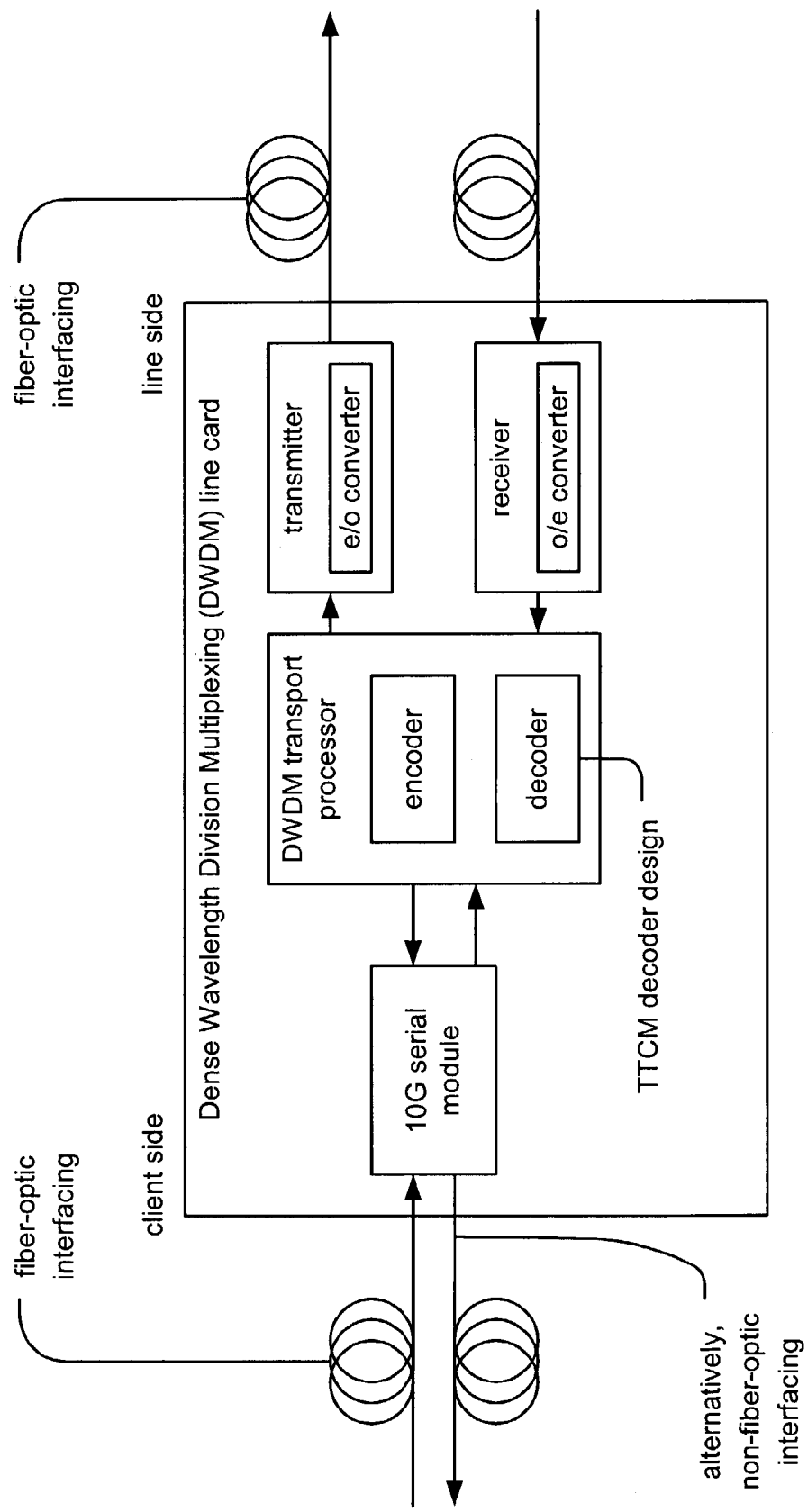
FIG. 8 is a system diagram illustrating an embodiment of a fiber-optic communication system that is built according to the invention.

FIG. 8 is a system diagram illustrating an embodiment of a fiber-optic communication system that is built according to the invention. The fiber-optic communication system is operable to support the TTCM decoder design of the invention. The FIG. 8 shows yet another of the many embodiments where a decoder, here implemented as a portion of a system, may be implemented according to the invention. The fiber-optic communication system includes a Dense Wavelength Division Multiplexing (DWDM) line card that is interposed between a line side and a client side.

DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32 according to some estimates. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantage of DWDM can be summarized as follows:

The transparency of DWDM: because DWDM is a physical layer architecture (PHY), it can transparently support both Time Division Multiplexing (TDM) and data formats such as asynchronous transfer mode (ATM), Gigabit Ethernet, ESCON, and Fibre Channel with open interfaces over a common physical layer.

The scalability of DWDM: DWDM can leverage the abundance of dark fiber (fiber-optic cabling installed but not yet being used) in many metropolitan area and enterprise networks to quickly meet demand for capacity on point-to-point links and on spans of existing SONET/SDH rings.

The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10G serial module. That is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides. The decoder may be implemented within the receiver to support the TTCM decoder design of the invention.

Figure 9:
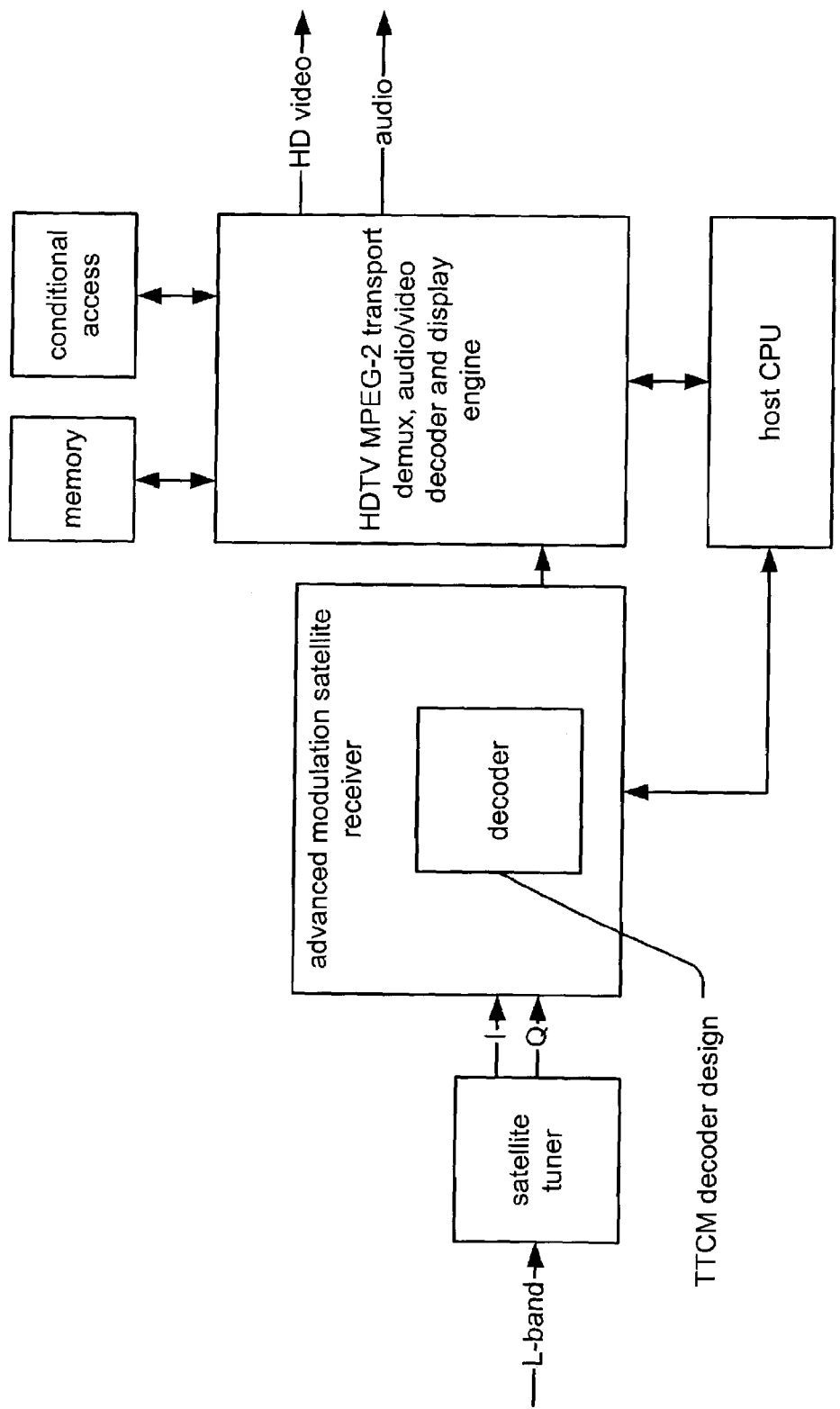
FIG. 9 is a system diagram illustrating an embodiment of a satellite receiver set-top box system that is built according to the invention.

FIG. 9 is a system diagram, illustrating an embodiment of a satellite receiver set-top box system that is built according to the invention. The satellite receiver set-top box system includes an advanced modulation satellite receiver that is implemented in an all digital architecture. The satellite receiver set-top box system includes a satellite tuner that receives a signal via the L-band. The satellite tuner extracts I,Q (in-phase and quadrature) components from a signal received from the L-band and provides them to the advanced modulation satellite receiver. The advanced modulation satellite receiver includes an embodiment of the decoder. The decoder may be implemented to support the TTCM decoder design of the invention.

The advanced modulation satellite receiver communicatively couples to an HDTV MPEG-2 (Motion Picture Expert Group) transport de-mux, audio/video decoder and display engine. Both the advanced modulation satellite receiver and the HDTV MPEG-2 transport de-mux, audio/video decoder and display engine communicatively couple to a host Central Processing Unit (CPU). The HDTV MPEG-2 transport de-mux, audio/video decoder and display engine also communicatively couples to a memory module and a conditional access functional block. The HDTV MPEG-2 transport de-mux, audio/video decoder and display engine provides HD video and audio output that may be provided to an HDTV display.

The advanced modulation satellite receiver is a single-chip digital satellite receiver supporting the decoder that is operable to support the TTCM decoder design of the invention. The advanced modulation satellite receiver is operable to receive communication provided to it from a transmitter device that includes an encoder as well.

In addition, several of the following Figures describe particular embodiments that may be used to implement the various embodiment of the TTCM decoder design that allows for greatly improved processing speed and efficiency when decoding received signals.

Figure 10:
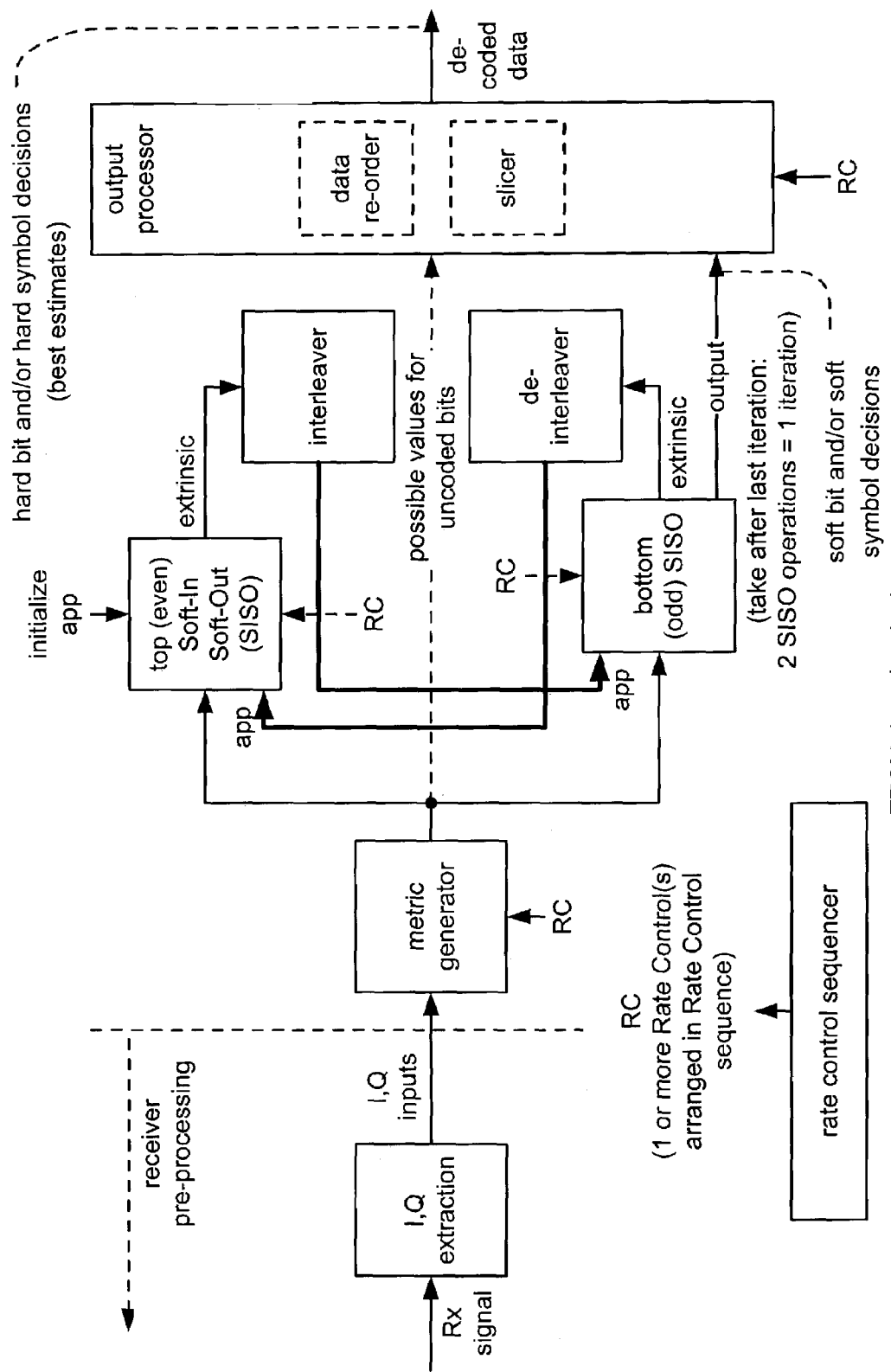
FIG. 10 is a diagram illustrating an embodiment of a TTCM (Turbo Trellis Coded Modulation) decoder design that is built according to the invention.

FIG. 10 is a diagram illustrating an embodiment of a TTCM (Turbo Trellis Coded Modulation) decoder design that is built according to the invention. A received signal is provided to an I,Q extraction functional block that extracts the I,Q (in-phase and quadrature) components from the received signal (shown as Rx signal) that are mapped according to a rate control (RC) as determined by a rate control sequencer. This extraction of the I,Q components of the received signal may be viewed as being receiver pre-processing. The I,Q is then mapped according to the modulation's appropriate constellation and mapping. Then, the mapped I,Q is passed to a metric generator that also receives the RC input from the rate control sequencer. The metric generator generates the appropriate metrics that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

Thereafter, we then compare the metric associated with uncoded bit (for the situation where the uncoded bit u=0) with the metric associated with uncoded bit (for the situation where the uncoded bit u=1), and we select the smaller metric value. The smaller metric value is deemed a higher likelihood than the larger metric value according to this embodiment's convention; alternatively, in other embodiments, a larger metric value may be used to indicate a higher likelihood as being the correct value. We also select value of u based on which metric has the smaller value. We select the possible value of the uncoded bit u to be 1 or 0 as determined by which of the associated metrics has the smaller value (metric associated with uncoded bit (u=0) or the metric associated with uncoded bit (u=1)). In certain embodiments, we may perform a min* operation that includes a logarithmic correction in selecting the smaller metric. Alternatively, we may perform a max* operation that includes a logarithmic correction in selecting the smaller metric. In even other embodiments, a simple min or max calculation may be employed. It is noted that the various embodiments of the invention may be implemented using the max* operations in lieu of the min* operation when preferred in a given implementation.

The min* calculation may be expressed as follows:

$$\min{}^*(A, B) = \min(A, B) - \ln(1 + e^{|A-B|})$$

The max* calculation may be expressed as follows:

$$\max{}^*(A, B) = \max(A, B) + \ln(1 + e^{|A-B|})$$

As an example of this operation, we will consider a received symbol, as determined by a particular RC, that is expected to have a form of $uc_2c_1c_0$, where u represents an uncoded bit, and the c's represent coded bits—all of a 4 bit symbol. We then set u=1 and then u=0 for every combination (looking at $C_2c_1c_0$=111 as an example), so we deal with the two possible values for $uc_2c_1c_0$=0111 and $uc_2c_1c_0$=1111. We then compare the location of the received symbol, as mapped within the constellation, to the two constellation points indexed by 0111 and 1111. We then select from these two constellation points indexed by 0111 and 1111 based on which one has the smaller valued metric. So, in this RC 5 example used here, we reduce the total number of 16 metrics down to 8. We then store these 8 metric values and 8 possible uncoded bit values (indexed by the metrics indices for each symbol in a received frame—a frame may also be referred to as a block), for subsequent use in decoding the uncoded bit after we have decoded the input bits, 1011. After we perform decoding of the input bits, 1011, then we will know with certainty what the bits $c_2c_1c_0$ are, and then we may directly determine the uncoded bit value u based on these 8 possible uncoded bit values that we have stored.

Continuing on with the decoding process and functionality within this figure, the metrics that are calculated by the metric generator are then provided to a top (even) SISO and simultaneously to a bottom (odd) SISO. Each of these SISOs and calculates forward metrics (alphas) and backward metrics (betas), and extrinsic values according to the particular trellis employed. These alphas, betas, and extrinsics are all calculated for each symbol within a frame (again, a frame may sometimes referred to as a block) that is to be decoded. These calculations of alphas, betas, and extrinsics are all based on the trellis and according to the RC provided by the RC input from the rate control sequencer. The manner in which the alphas, betas, and extrinsics is performed is described in more detail below. The processing of a received block of data employs an approach that employs skip-back processing as is described in more detail below as well.

Starting with the top SISO, after the extrinsic values have been calculated, they are passed to an interleaver after which they is passed to the bottom SISO as "a priori probability" (app) information. Similarly, after extrinsic values have been calculated within the bottom SISO, they are passed to a de-interleaver after which it is passed back to the top SISO as "a priori probability" (app) information. It is noted that a single decoding iteration, within the iterative decoding process of the TTCM decoder design consists of performing two SISO operations; that is to say, the iterative decoding process must pass through both the top (even) SISO and through the bottom (odd) SISO to perform one iteration of decoding.

After a significant level of confidence has been achieved and a solution is being converged upon, or after a predetermined number of decoding iterations have been performed, then the output from the bottom (odd) SISO is passed as output to an output processor. The output processor is operable to perform reordering of the data that is provided to it from the SISO as well as slicing of the received soft decisions. The slicer compares the received soft decision to a threshold and then makes a hard determination based on whether the soft decision value is above or below the threshold. The SISO will provide the data to the output processor in an order that is described in greater detail below. The operation of the SISOs may generally be referred to as calculating soft symbol decisions of the symbol contained within the received symbol. These soft symbol decisions may be performed on a true bit level in certain embodiments. The output processor uses these soft symbol decisions (and/or soft bit decisions) to generate hard symbol decisions (and/or hard bit decisions) for the input bits $i_0i_1$ of the input symbol and to provide decoded output data; these hard symbol and/or hard bit decisions may be viewed as being best estimates of the input symbols and/or the input bits contained therein.

Moreover, in the situation where we have one or more uncoded bits u that results from the coding of the input bits, 1011, we then also need to use as many as 8 possible uncoded bit values (indexed by the metrics indices) according to the embodiment described above, so that we can directly determine the value of the uncoded bit.

It is also noted that the app sequence for the top (even) SISO must be initialized before beginning the iterative decoding. The notation for the app sequence app[i][j][k] is as follows:

1. i represents the possible binary value of the estimated bit
2. The positions of the estimated bit are denoted as follows: (j=0 refers the first bit into the encoder and j=1 refers the second bit into the encoder)
3. k is the index of the symbol's location within the data block (or frame).

More specifically, k represents the symbol index of the symbols in a frame of data, j is the bit index (i=0 for bit $i_1$ and j=1 for bit $i_0$), and i is the bit value (i=0 or 1). For example, app[1][0][50] represents the app for bit $i_1$ of the $50^{th}$ symbol being a value of 1.

At least two ways to initialize app[i][j][k] are described below:

1. app[i][j][k]=0.0,i,j∈{0,1},k∈{0, . . . ,N−1}. Each and every TTCM coding, using any of the possible combination of RCs for a rate control sequence may use this initialization.

2. The TTCM coding with RC sequence 8 can have different initialization defined as follows.

app[0][1][k]=0.0
app[1][1][k]=MAX, for all possible k.
app[0][0][k]=0.0

For the sequence app[0][0][k], we may first define the sequence based on the rate control sequence using the intermediate variable pP and pP* (which denotes the interleaved version of pP).

pP[1][0][k]=MAX for RC 8
pP[1][0][k]=0.0 otherwise

Then, we interleave this sequence with de-interleave $\pi^{-1}$ is employed to generate the sequence pP*[1][0][k]. Finally, we define the initial app[1][0][k] as follows:

app[1][0][k]=pP[1] [0][k] if k mod2=0
app[1][0][k]=pP*[1][0][k] if k mod2=1

Moreover, by using the interleaving $\pi$, we can directly define the app[1][0][k] as follows:

app[1][0][k]=MAX if RC $[\pi(\tilde{k})]$=8
app[1][0][k]=0.0 otherwise

Further detail of the TTCM decoding functionality and operation is provided within several of the following Figures.

Figure 11:
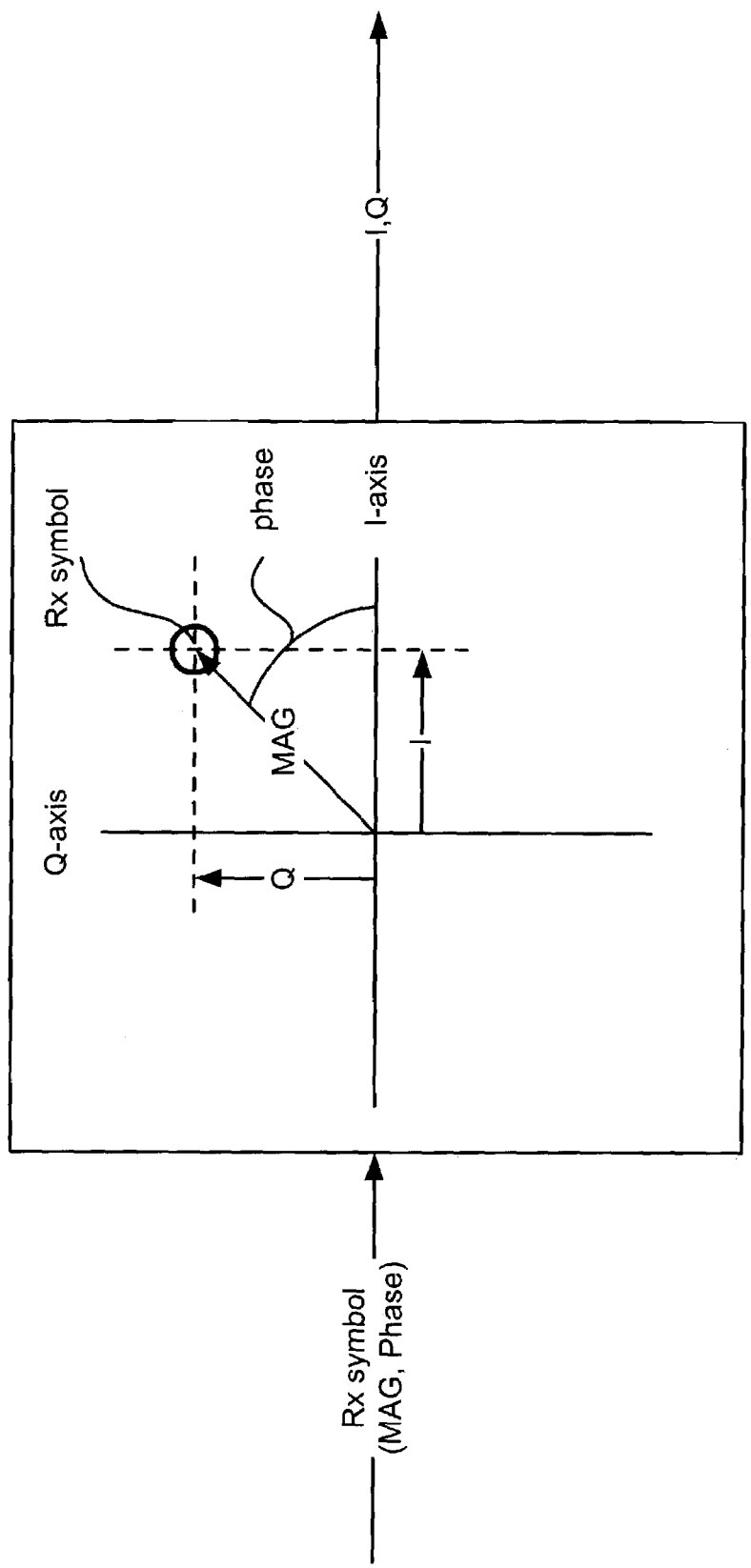
FIG. 11 is a diagram illustrating in-phase and quadrature (I,Q) signal extraction that is performed according to the invention.

FIG. 11 is a diagram illustrating in-phase and quadrature (I,Q) signal extraction that is performed according to the invention. A received symbol, having a magnitude and phase is provided to an I,Q extraction block. This symbol (or signal) is mapped in a two dimensional space such that an in-phase and a quadrature component may be extracted. This in-phase measurement and the quadrature component are provided as output from the I,Q extraction functional block. The I,Q components of the received signal may be viewed as being the baseband (BB) component of the signal.

Figure 12:
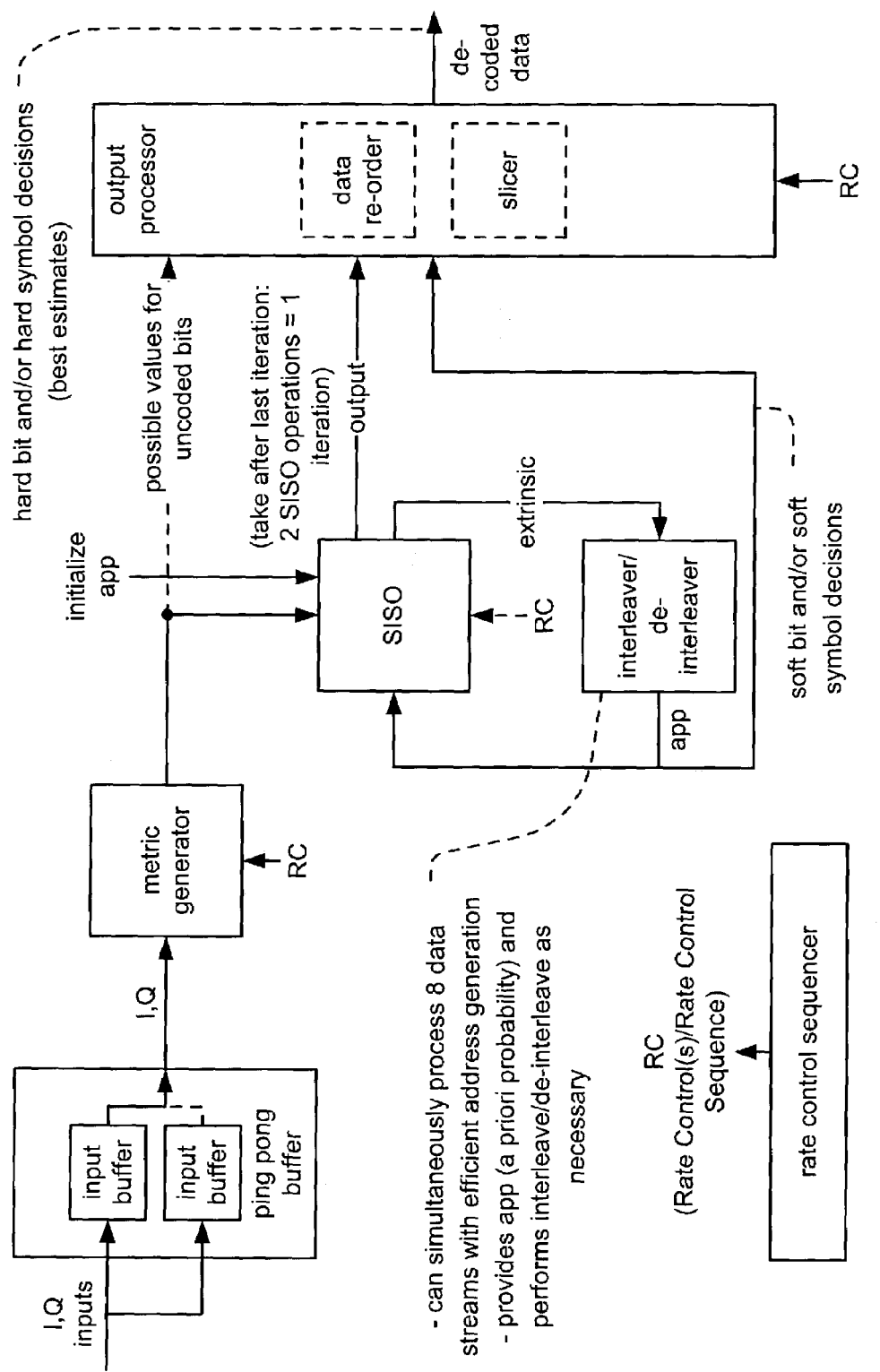
FIG. 12 is a diagram illustrating an alternative embodiment of a TTCM decoder design that is built according to the invention that recycles a single SISO (soft-in soft-out functional block).

FIG. 12 is a diagram illustrating an alternative embodiment of a TTCM decoder design that is built according to the invention that recycles a single SISO (soft-in soft-out functional block). This alternative TTCM decoder design receives as input the I,Q from a received signal. Similar to embodiments described above, an I,Q extraction functional block may also be employed to extract these I,Q inputs as well when performing receiver pre-processing. A ping pong buffer, employing two input buffers, may be employed for efficient buffering of the I,Q inputs. The I,Q inputs are then passed to the metric generator.

The output of the metric generator is passed to the single SISO; the information necessary to perform decoding of any possible uncoded bits will be passed to the output processor. The SISO calculates forward metrics (alphas), backward metrics (betas), and extrinsic values (exts) according to the trellis employed and provides them to a functional block that is operable to perform both interleaving and de-interleaving (depending upon which particular SISO operation is being performed within the given decoding iteration). The output of the interleaver/de-interleaver functional block is passed back to the SISO as app within a given SISO operation.

Similar to the embodiment described above, it is noted that a single decoding iteration, within the iterative decoding process of the alternative TTCM decoder design consists of performing two SISO operations; that is to say, the iterative decoding process must pass through both the SISO once (when the SISO performs the top SISO functionality) and through the SISO again (when the SISO performs the bottom SISO functionality).

After a significant level of confidence for the soft symbol decisions within the SISO have been achieved and a solution is being converged upon, or after a predetermined number of decoding iterations have been performed, then the output from the SISO is passed as output to the output processor. These soft symbol decisions may also be performed on a true bit level in certain embodiments. The output processor uses these soft symbol decisions to generate hard symbol decisions and to provide decoded output data. It is also noted that a similar app initialization may be performed here as within the embodiment described above.

Figure 13:
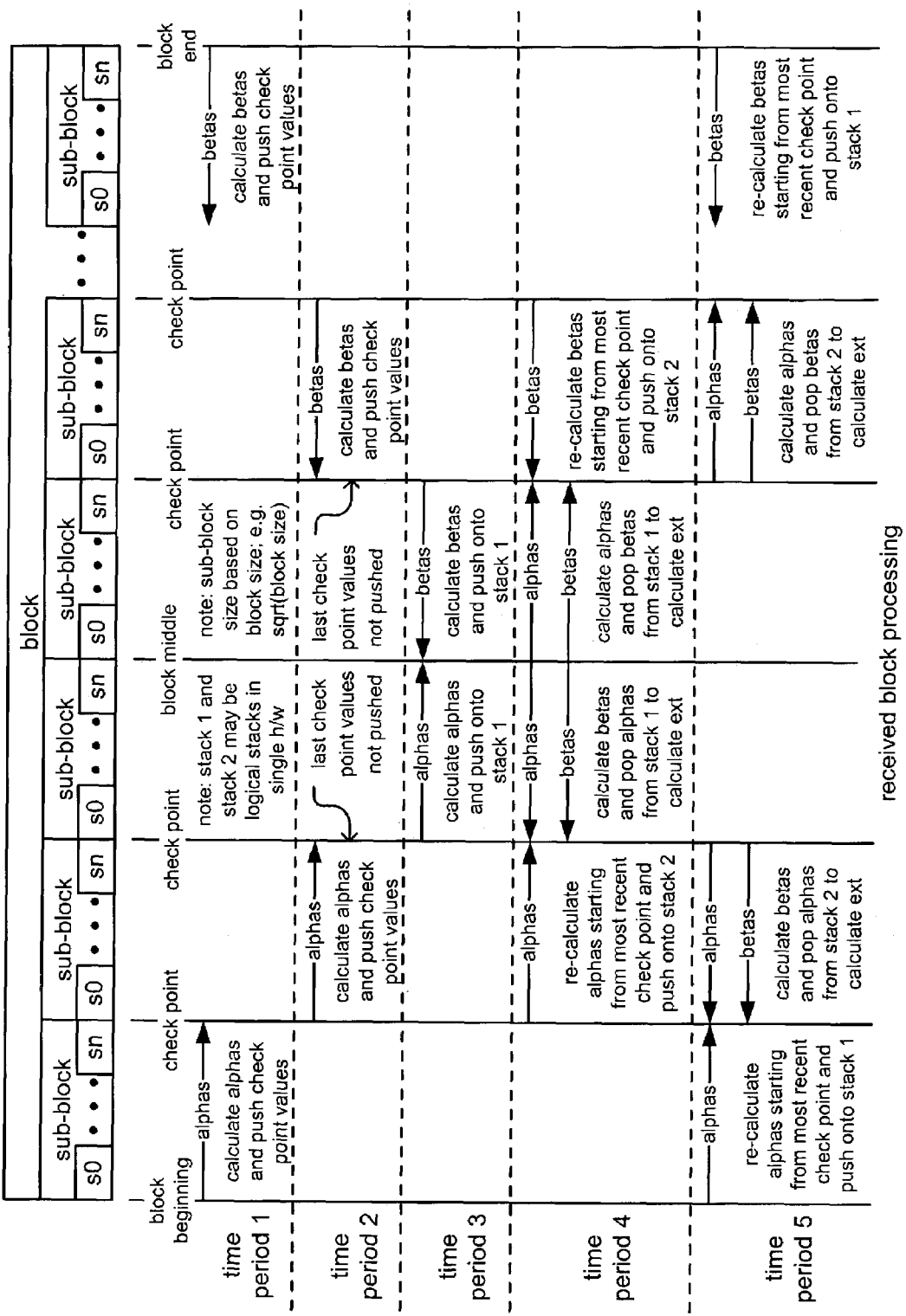
FIG. 13 is a diagram illustrating an embodiment of received block processing that is performed according to the invention.

FIG. 13 is a diagram illustrating an embodiment of received block processing that is performed according to the invention. For illustration, the processing of a block of data, sub-divided into sub-blocks each having a number of symbols. The size of each sub-block, and consequently the total number of sub-blocks, into which the block is divided may be intelligently determined as being the square root of the total block size, e.g., sqrt(block size). The processing of the block is shown here as being performed in 5 separate time period intervals. Alternatively, the processing operations shown within the time period 1, time period 2, and time period 3 may all be considering as being a single time period as describe in more detail below. However, for clarity of illustration, these time periods are shown distinctly here so that the processing of the symbols within the sub-blocks of the block may be more fully understood. In addition, the temporary storage of some of the variables may be performed using a stack/FILO memory device; two or more stacks may physically be located within the same portion of hardware and being logically partitioned therein.

Beginning with time period 1, the processing of the block begins simultaneously at both ends of the block (which may be referred to as a block beginning and a block end). Looking at the sub-blocks beginning from the left hand side of the block (block beginning) during time period 1, the forward metrics (alphas) for each symbol of the sub-block is calculated and the check point values, associated with the beginning/initial alpha conditions of the sub-block are pushed onto an alpha/beta stack (e.g., a FILO memory device). Similarly, looking at the sub-blocks beginning from the right hand side of the block (block end) during time period 1, the backward metrics (betas) for each symbol of the sub-block is calculated and the check point values, associated with the beginning/initial beta conditions of the sub-block are pushed onto the alpha/beta stack as well. The processing from both block ends is performed simultaneously when proceeding towards the block middle; it is noted that each and every alpha and beta for the symbols within these sub-blocks are not stored, but only the associated alpha and beta check point values. These check point values are used later for use in skip-back processing to re-calculate the alpha and beat values for each respective sub-block.

Continuing with time period 2, similar processing as described above with respect to time period 1 is performed on the sub-blocks that are the adjacent to the sub-blocks located at the ends of the block. For example, after the recursive calculation of the alphas have been performed on the left most sub-block, and after the check point alpha values have been stored, then the processing continues on to the next sub-block (the $2^{nd}$ sub-block from the left end of the block) to perform analogous calculations of the alphas for the symbols contained therein and the respective check point alpha values are then stored as well. The check point alpha values for this sub-block as well will be used for use in re-calculation of the alpha values associated with each symbol of this sub-block.

Similarly, after the recursive calculation of the betas have been performed on the right most sub-block, and after the check point beta values have been stored, then the processing continues on to the next sub-block (the $2^{nd}$ sub-block from the right end of the block) to perform analogous calculations of the betas for the symbols contained therein and the respective check point beta values are then stored as well. The check point beta values for this sub-block as well will be used for use in re-calculation of the beta values associated with each symbol of this sub-block.

However, during the time period 3, when the processing reaches the two sub-blocks that are adjacent to the block middle, then the processing id modified a bit. For example, when processing the two sub-blocks adjacent to the block middle, then the actual values for each and every alpha (or beta, depending on which sub-blocked is being referred) are pushed onto a stack. For example, looking at the sub-block immediately to the left of the block middle, the alpha values are pushed onto a first stack (stack 1); simultaneously, looking at the sub-block immediately to the right of the block middle, the beta values are pushed onto a second stack (stack 2).

After the processing reaches the block middle, as shown in a time period 4, the processing then proceeds to perform two separate operations simultaneously. For example, the processing of betas continues on in the same direction (to the left of the block middle and towards the block beginning) to calculate the betas for the sub-block immediately to the left of the block middle. In addition, the corresponding alpha values that have just been stored, as described above in the time period 3, are also retrieved (popped off the stack 1) for each symbol for which a corresponding beta value has just been calculated. Immediately thereafter, now that the alpha and beta values are available for each of the symbols within this sub-block, they are used to calculate the extrinsic information for that symbol.

An analogous operation takes place simultaneously in the sub-block immediately to the right of the block middle. For example, the processing of alphas continues on in the same direction (to the right of the block middle and towards the block end) to calculate the alphas for the sub-block immediately to the right of the block middle. In addition, the corresponding beta values that have just been stored, as described above in the time period 3, are also retrieved (popped off the stack 2) for each symbol for which a corresponding alpha value has just been calculated. Immediately thereafter, now that the alpha and beta values are available for each of the symbols within this sub-block, they are used to calculate the extrinsic information for that symbol.

As can now be understood, the extrinsic values for each symbol, beginning from the middle and proceeding towards both block ends ([1] from the block middle towards the block beginning on the left hand side and [2] from the block middle towards the block end on the right hand side), may be immediately calculated.

Simultaneously within the time period 4, skip-back processing is performed on the adjacent sub-blocks to re-calculate the alphas and betas, respectively. For example, within the sub-block located adjacent to the left of the sub-block that is located immediately to the left of the block middle, the alpha check point value for the beginning of this sub-block is retrieved for use in re-calculating the alpha values for this sub-block; these re-calculated alphas are them pushed onto the second stack (stack 2).

Similarly, within the sub-block located adjacent to the right of the sub-block that is located immediately to the right of the block middle, the beta check point value for the beginning of this sub-block is retrieved for use in re-calculating the beta values for this sub-block; these re-calculated betas are them pushed onto the second stack (stack 2) as well.

As shown during the time period 5, a similar processing as described above with respect to the time period 4 is performed with the exception that the processing being shifted one sub-block outward towards the two block ends. That is to say, the calculation of the alphas and retrieving of the betas (or alternatively the calculation of the betas and retrieving of the alphas) is performed so that the alpha and beta values for each symbol of this sub-block is made available for immediate calculation of extrinsic values. This processing, as shown in the sub-blocks for the time period 4 and the time period 5 is performed until the two ends of the block are reached (the block beginning and the block end).

Generally speaking, the overall processing of the block may also be described as follows: alpha values are calculated in one direction (starting from one end of the block) and beta values are calculated in the opposite direction (starting from the other end of the block) and the associated check point values alphas/betas are stored. Once the processing reaches the two sub-blocks adjacent to the block middle, then the values for the alphas and beta (depending on the respective sub-block) are stored. Once the processing reaches the actual block middle, then the two processing paths cross one another; the alphas continue to be calculated for each sub-block in the same direction that alphas have been calculated (shown here as from left to right), and the betas continue to be calculated for each sub-block in the same direction that betas have been calculated (shown here as from right to left). Simultaneously, the respective alpha or beta value that was just previously calculated for these respective sub-blocks is retrieved for use in calculating the extrinsic values for these symbols. This processing will continue on, stepping outward one sub-block at a time away from the block middle at a time, until all of the sub-blocks within the total block have been processed. Using this efficient received block processing, it can be seen that once the block middle has been reached, then extrinsic values for each symbol may be successively calculated and output starting from the block middle and extending simultaneously towards both block ends (towards the block beginning and the block end).

Figure 14:
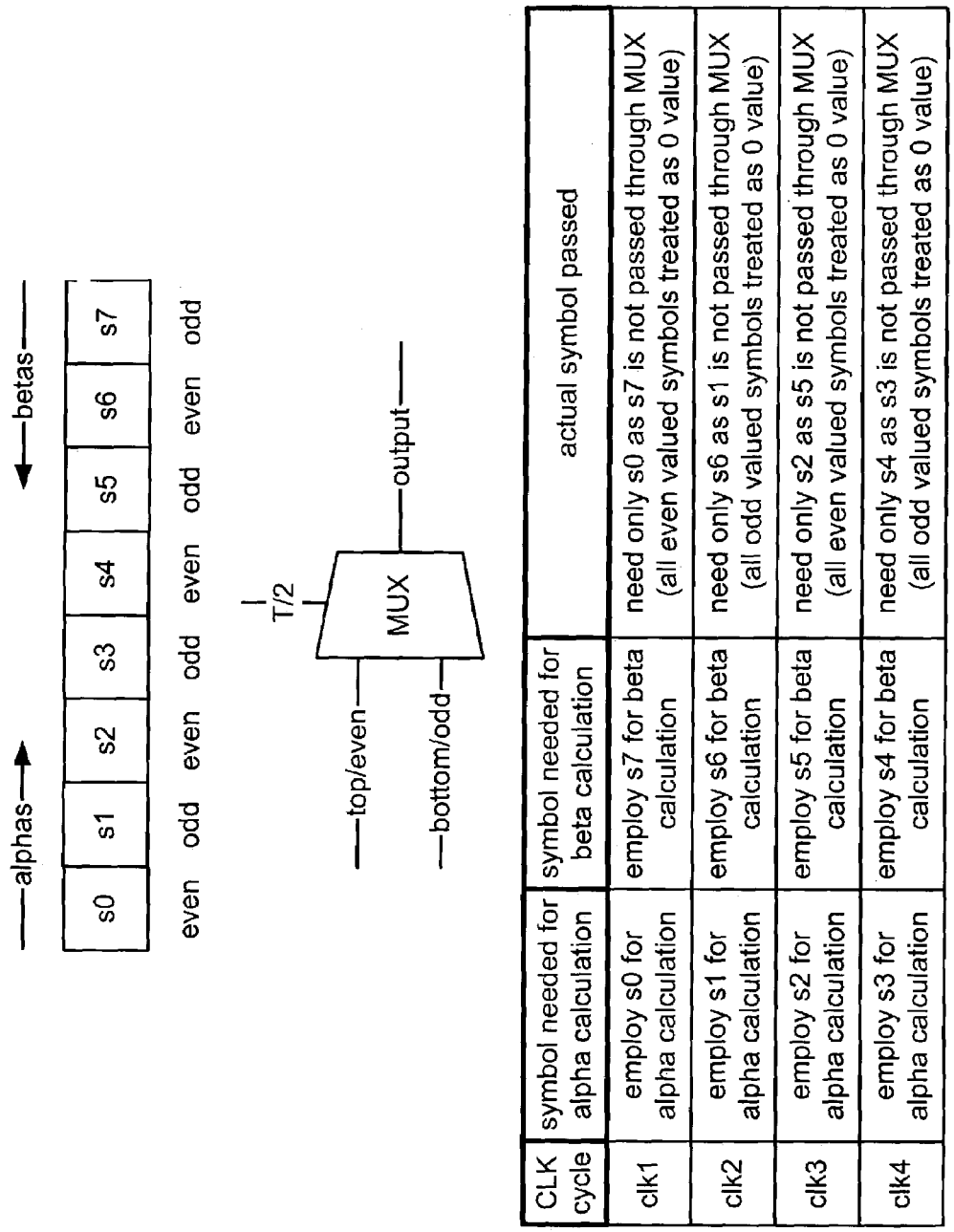
FIG. 14 is a diagram illustrating an embodiment of how symbols may be passed for metric calculation according to the invention (shown using an 8 symbol embodiment).

FIG. 14 is a diagram illustrating an embodiment of how symbols may be passed for metric calculation according to the invention (shown using an 8 symbol embodiment). The order of received symbols within a block that are passed for metric calculation will be different than the order in which they are passed from SISO operations, as is described below. For simplicity and clarity of illustration, an eight symbol block is shown here to demonstrate the operation; the symbols of the block being shown as being s0, s1, s2, . . . , and s7. The symbols are provided to a MUX (multiplexor) whose selection is ½ of the given available clock signal (shown as T/2).

For example, during a first clock cycle (clk1), the symbol s0 should be employed for alpha calculation, and the symbol s7 should be employed for beta calculation. However, the actual passing of symbols for each ½ clock cycle (T/2) will alternate as the even and/or odd symbols may be treated as zero valued symbols for every other clock cycle. This is because of the fact that the selection of the MUX is based on the clock having a rate of T/2. During this first clock cycle, only the odd located symbol need be sent, namely, s0; the even located symbol s7 need not be sent since it may be treated as if it were a zero valued symbol according to the operation of the MUX (the MUX will only select the odd located symbol from the block).

As the processing continues, during this second clock cycle (clk2), moving towards the block middle from both of the two ends of the block, all of the odd located symbols may then be treated as if they were zero valued symbols according to the operation of the MUX (the MUX will only select the even located symbol from the block). During the second clock cycle (clk2), the symbol s1 should be employed for alpha calculation, and the symbol s6 should be employed for beta calculation. During this second clock cycle, only the even located symbol need be sent, namely, s6; the even located symbol s1 need not be sent since it may be treated as if it were a zero valued symbol according to the operation of the MUX (the MUX will only select the even located symbol from the block and the odd located symbol may be treated as being a zero valued symbol).

This processing continues for the third and fourth clock cycles (clk3 and clk4, respectively). For example, during the third clock cycle (clk3), the symbol s2 should be employed for alpha calculation, and the symbol s5 should be employed for beta calculation. During this third clock cycle, only the odd located symbol need be sent, namely, s2; the even located symbol s5 need not be sent. In addition, during the fourth clock cycle (clk4), the symbol s3 should be employed for alpha calculation, and the symbol s4 should be employed for beta calculation. During this fourth clock cycle, only the even located symbol need be sent, namely, s4; the odd located symbol s3 need not be sent.

Again, it is noted that this shows the order of the symbols provide for use in performing metric calculation using a metric generator. While an 8 symbol embodiment is described here, it is clear that this approach may be extended to larger sized block as well without departing from the scope and spirit of the invention. This order of output associated with the metric generator is also described below in contradistinction to the order in which output is provided from the SISO.

FIG. 15A is a diagram illustrating an embodiment of the order of output from a metric generator according to the invention (which is the same order of output from an interleaver/de-interleaver according to the invention). As described above in greater detail above with respect to the order in which symbols are passed for metric calculation (described above using an 8 symbol embodiment), the order in which output is provided from the metric generator is shown as being provided from the two ends of the block and proceeding towards the block middle. To comply with the convention that the proper order of the block should be from left to right (the order in which the data is received), the manner in which the symbols and associated calculation results are stored is performed differently. This is performed to accommodate the manner of processing of the block that enables the very fast and efficient processing approach of the invention. The storage of these values, to support the processing of the invention, may be performed into a logically partitioned Random Access Memory (RAM) portion. In this embodiment, the RAM is partitioned into an upper portion of RAM and a lower portion of RAM.

More specifically, the output of the metric generator that is associated with the left portion of the block in written into the upper portion of the RAM in a FIFO (First In-First Out) manner. The reason that the data may be written in the FIFO manner is that the data is already in the proper order (being processed from left to right). Alternatively, the output of the metric generator that is associated with the right portion of the block in written into the lower portion of the RAM in a stack/FILO (First In-Last Out) manner. The reason that the data may be written in the FILO manner is that the data is not in the proper order from the perspective of the order in which the data is received (it is being processed from right to left which is the opposite order that is desired). It is also noted that this order of data from the metric generator is the same order of output from the interleaver/de-interleaver.

FIG. 15B is a diagram illustrating an embodiment of the order of output from a SISO (soft-in soft-out functional block) according to the invention. The order of output of the SISO may be viewed as being in contradistinction to the order of output from either the metric generator or the interleaver/de-interleaver. As described above, the output of the SISO will provide the data in an order that begins from the block middle and extends towards both of the two block ends. The manner in which this data should be written is the converse of the manner in which it is done for the metric generator as described above.

The output of the SISO that is associated with the left portion of the block in written into the lower portion of the RAM in a stack/FILO manner. The reason that the data may be written in the FILO manner is that the data is not in the proper order from the perspective of the order in which the data is received (it is being processed from right to left which is the opposite order that is desired). Alternatively, the output of the SISO that is associated with the right portion of the block in written into the upper portion of the RAM in a FIFO manner. The reason that the data may be written in the FIFO manner is that the data is already in the proper order (being processed from left to right).

Figure 16:
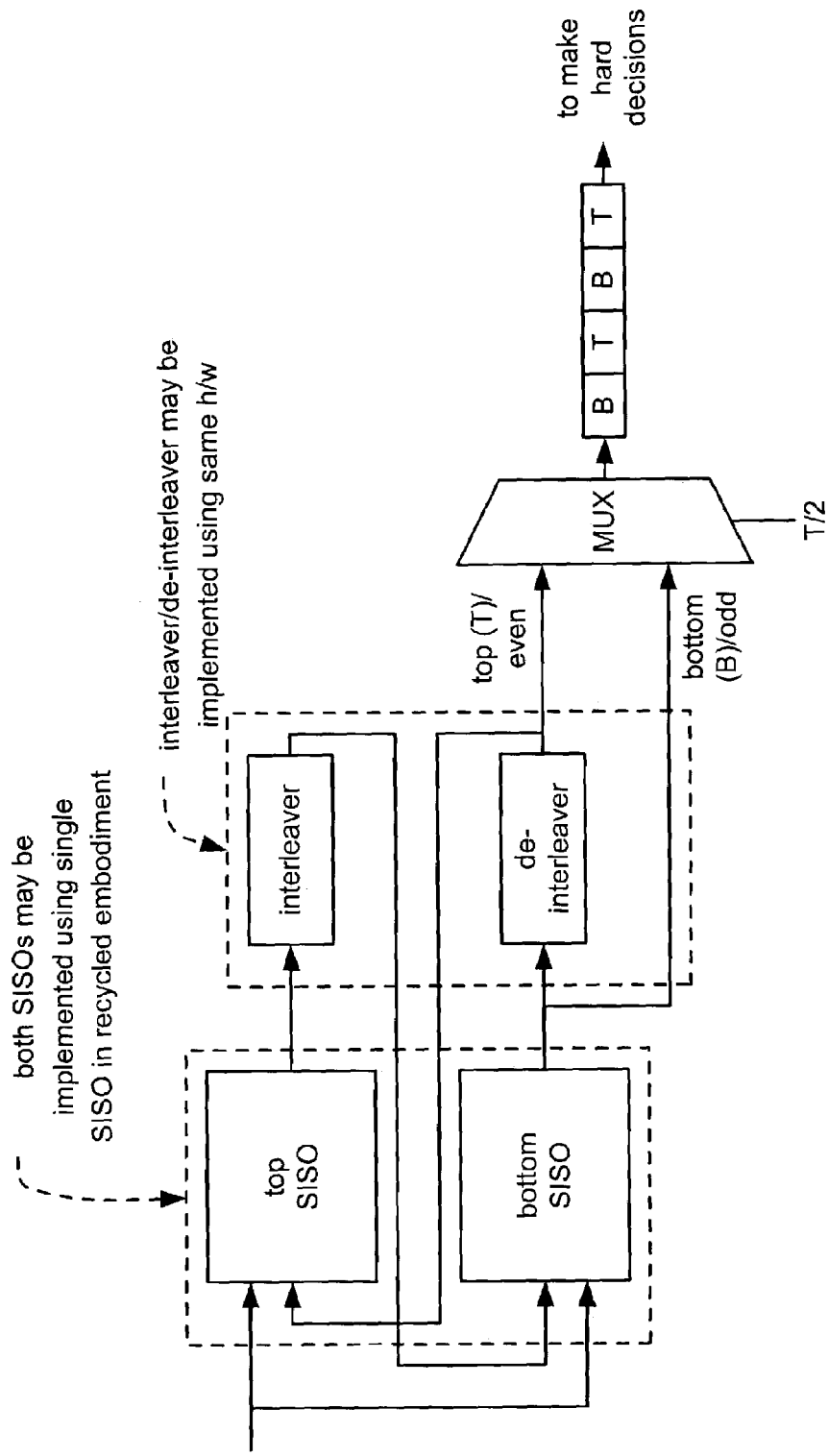
FIG. 16 is a diagram illustrating an embodiment of the final output of decoding that may be provided to make hard decisions according to the invention.

FIG. 16 is a diagram illustrating an embodiment of the final output of decoding that may be provided to make hard decisions according to the invention. In the situation where there may be only one SISO, then the odd symbol should be taken before de-interleave and the even symbol should be taken after de-interleave. It is noted that the TTCM decoder design may be implemented using two separate SISOs or using a single SISO that is recycled to perform both SISO operations for each iteration of decoding without departing from the scope and spirit of the invention.

The functionality of this figure allows for preservation of the order of decoded symbols to match the order in which the input symbols have been input to an encoder (located within a transmitter at the other end of a communication channel) before being received by a receiver (that includes the TTCM decoder design according to the invention).

The final output of decoding ensures the following: when we input a symbol sequence, $S_1S_2S_3S_4$, to the encoder (again, located at a transmitter side of the communication channel), and then when the following encoded symbols ($S_{1-enc}S_{2-enc}S_{3-enc}S_{4-enc}$) are received by the decoder, then the decoded estimates of these received symbols will maintain this same sequential order. A MUX whose selection is provided by a clock signal that is clocked at ½ the rate (shown at T/2) will alternatively select the outputs from the output and input of the de-interleaver that is communicatively coupled to the lower SISO. If desired, the functionality of this MUX may be viewed as being within the output processor within any of the embodiments described above.

This figure shows an embodiment of how this may be performed in the final decoding step. Again, the functionality shown here may also be supported within embodiments where the functionality of the top and bottom SISOs are implemented as being performed within a single SISO that is recycled according to certain aspects of the invention.

Figure 17:
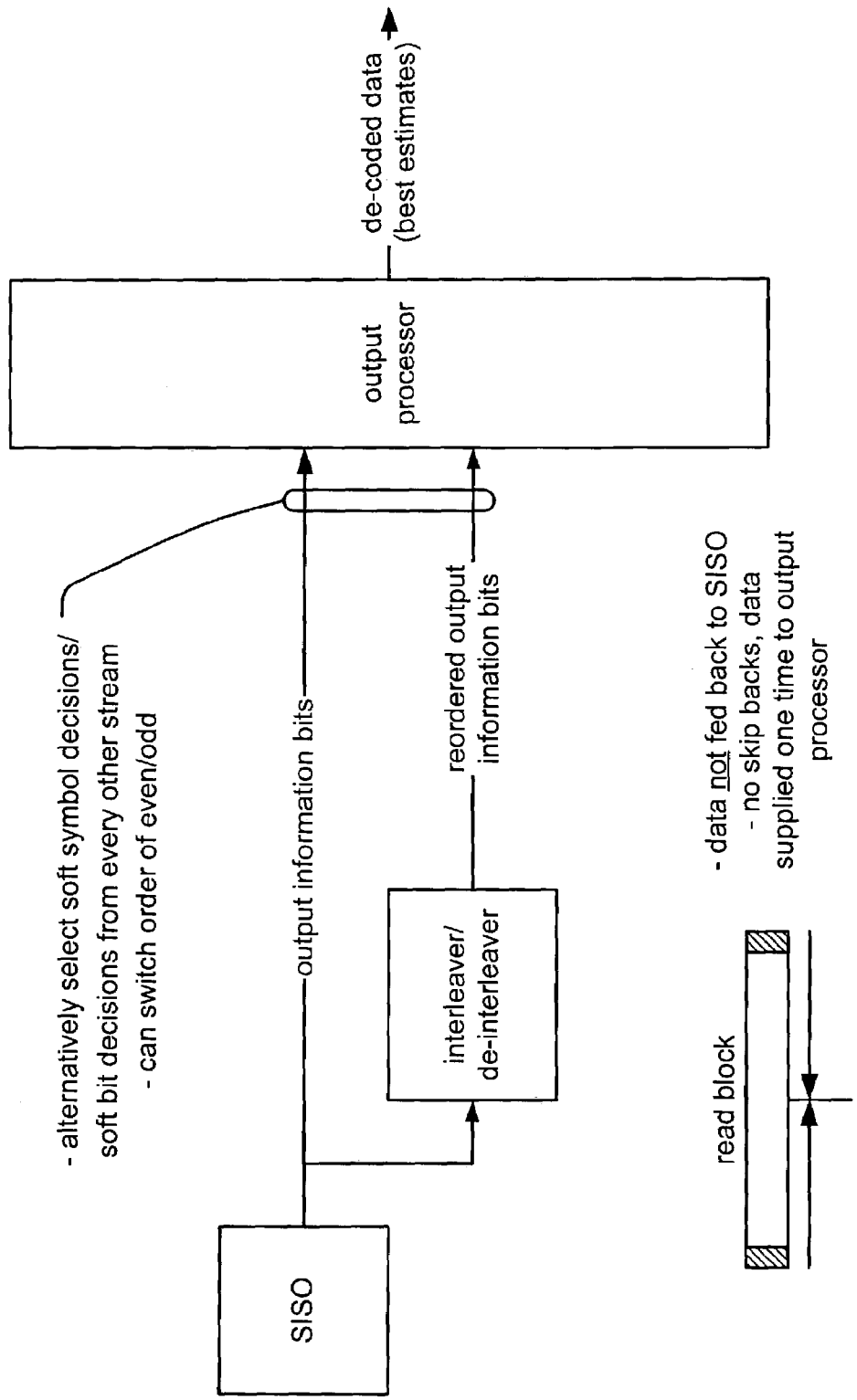
FIG. 17 is a diagram illustrating an embodiment of the last iteration of SISO processing according to the invention (shown in an embodiment using a recycled SISO).

FIG. 17 is a diagram illustrating an embodiment of the last iteration of SISO processing according to the invention (shown in an embodiment using a recycled SISO). This figure may be viewed as illustrating analogous functionality described in the preceding figure with the exception that a single recycled SISO is employed and the alternative selection of the output from the SISO and the interleaver/de-interleaver functionality (shown above as being performed using a MUX) is supported within the output processor. Functionally speaking, the soft symbol decisions and/or soft bit decisions may be viewed as being alternatively selected from every other stream. If desired, the order of selection of even/odd may be modified as desired within a given implementation.

It is also noted here the soft symbol decisions and/or soft bit decisions that are provided from the SISO and interleaver/de-interleaver functional blocks need only be provided to the output processor once; no skip-back processing need be performed as the output processor only needs the data supplied to it once and there is also no feedback of extrinsic information to the SISO during the last iteration of SISO processing.

Figure 18:
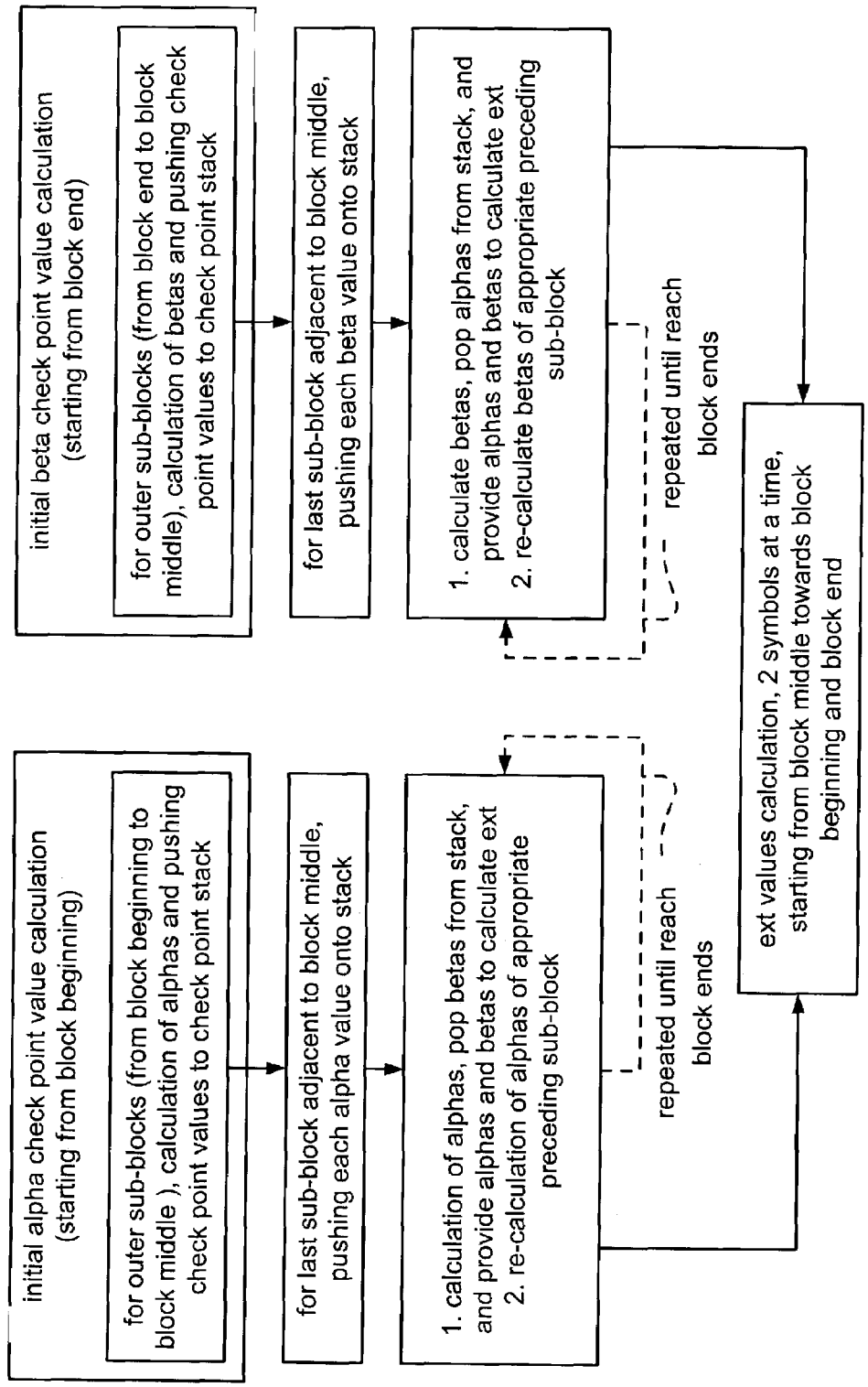
FIG. 18 is a diagram illustrating an embodiment of SISO received block processing functionality that is supported according to the invention.

FIG. 18 is a diagram illustrating an embodiment of SISO received block processing functionality that is supported according to the invention. In this figure, the initial alpha calculation and the beta calculation are shown as being performed simultaneously and in parallel. For example, the alpha calculation starts from the block beginning and proceeds towards the block middle. For the outer sub-blocks, being processed from the block beginning towards the block middle(located to the left of the block middle), the SISO received block processing functionality performs calculation of alphas and pushes the appropriate check point values to a check point stack. After the processing reaches the last sub-block that is to adjacent to the block middle, then each alpha value associated with the every symbol is pushed onto an alpha/beta stack.

As mentioned above, the initial alpha calculation is performed simultaneously with the initial beta calculation. For example, the beta calculation starts from the block end and proceeds towards the block middle. For the outer sub-blocks, being processed from the block end towards the block middle, the SISO received block processing functionality performs calculation of betas and pushes the appropriate check point values to a check point stack. After the processing reaches the last sub-block that is to adjacent to the block middle (located to the right of the block middle), then each beta value associated with the every symbol is pushed onto an alpha/beta stack.

The processing functionality then continues by performing skip-back processing for the previous sub-blocks that have been processed when calculating the alphas and betas, respectively, when calculating and storing the appropriate check point values. For example, the skip-back processing associated with the alpha processing involves the calculation of alphas while simultaneously popping the recently calculated betas from the alpha/beta stack. These alpha and beta values correspond to the current symbol are then provided for use in calculating the appropriate extrinsic value for the current symbol. In addition, simultaneously recalculation of alphas of the appropriate preceding sub-block is performed when the processing of this sub-block is being performed. This process will be repeated until the block ends are met.

Analogous processing is performed in the other direction that includes the recalculation of betas of the appropriate preceding sub-blocks. For example, the skip-back processing associated with the beta processing involves the calculation of betas while simultaneously popping the recently calculated alphas from the alpha/beta stack. These alpha and beta values correspond to the current symbol are then provided for use in calculating the appropriate extrinsic value for the current symbol.

It can be seen that there is a great deal of simultaneous and parallel processing provided by the invention. Cooperatively, this provides for extremely fast and efficient processing of a received block.

Figure 19:
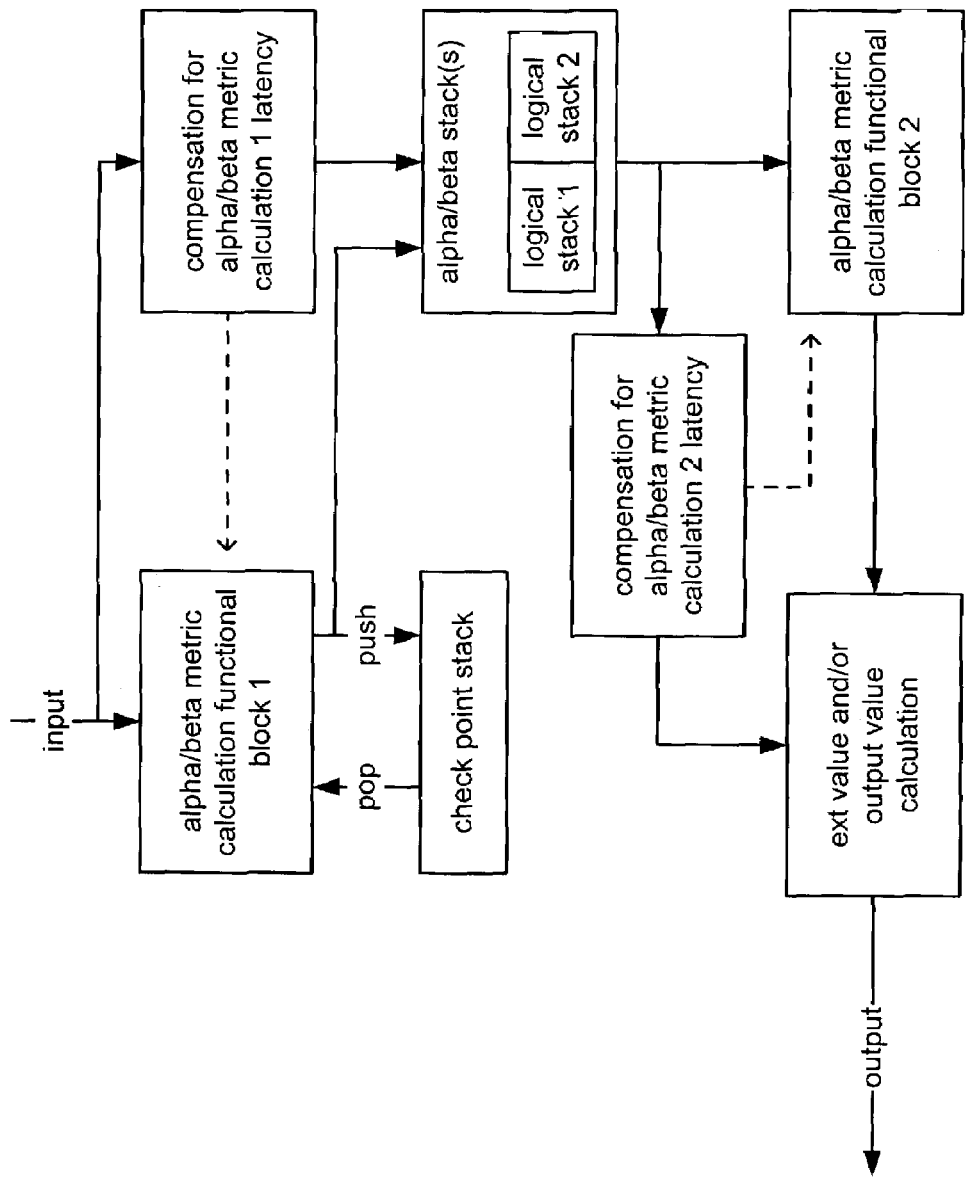
FIG. 19 is a diagram illustrating an embodiment of SISO functional block arrangement according to the invention.

FIG. 19 is a diagram illustrating an embodiment of SISO functional block arrangement according to the invention. The functional block arrangement of the FIG. 19 may be viewed as being one possible hardware implementation arrangement that will support the received block processing according to the invention including the skip-back processing. Input is provided to an alpha/beta calculation functional block 1 for use in performing the initial calculation of the alphas and betas starting from the ends of the block and proceeding towards the block middle. The appropriate check point values for each of the sub-blocks (being alpha check point values or beta check point values) are pushed onto a check point stack.

When the processing has reached the two sub-blocks adjacent to the block middle, then the values for each of the alpha (or beta, respectively) are pushed into a an alpha/beta stack that may be implemented as a logically partitioned stack. Thereafter, when the processing paths of each direction cross one another, a alpha/beta calculation functional block 2 may be implemented to perform the continued calculation of the alphas/betas in the same direction while the alpha/beta calculation functional block 1 performs the re-calculation using skip-back processing as described in other embodiments of the invention. These re-calculated values are then provided to the alpha/beta stack where they are stored in a logical partitioned region thereof.

An extrinsic value and/or output value calculation functional block receives these most recently calculated alpha and beta values calculated by the alpha/beta calculation functional block 2 and simultaneously retrieves the appropriate corresponding alpha or beta for a particular symbol (pops the appropriate corresponding alpha or beta from the appropriate portion of the alpha/beta stack) for use in calculating the extrinsic value associated with the symbol at hand. A compensation functional block is interposed between the alpha/beta stack and the extrinsic value and/or output value calculation functional block to compensate for the latency of the alpha/beta calculation functional block 2. Similarly, a compensation functional block is interposed between the alpha/beta calculation functional block 1 and the alpha/beta stack to compensate for the latency of the alpha/beta calculation functional block 1.

While this figure shows one possible functional block arrangement to support the calculation of the various values that are performed when processing a received block according to the invention, this illustrates just one possible implementation embodiment that may achieve the processing of the received block in the manner described herein.

Figure 20:
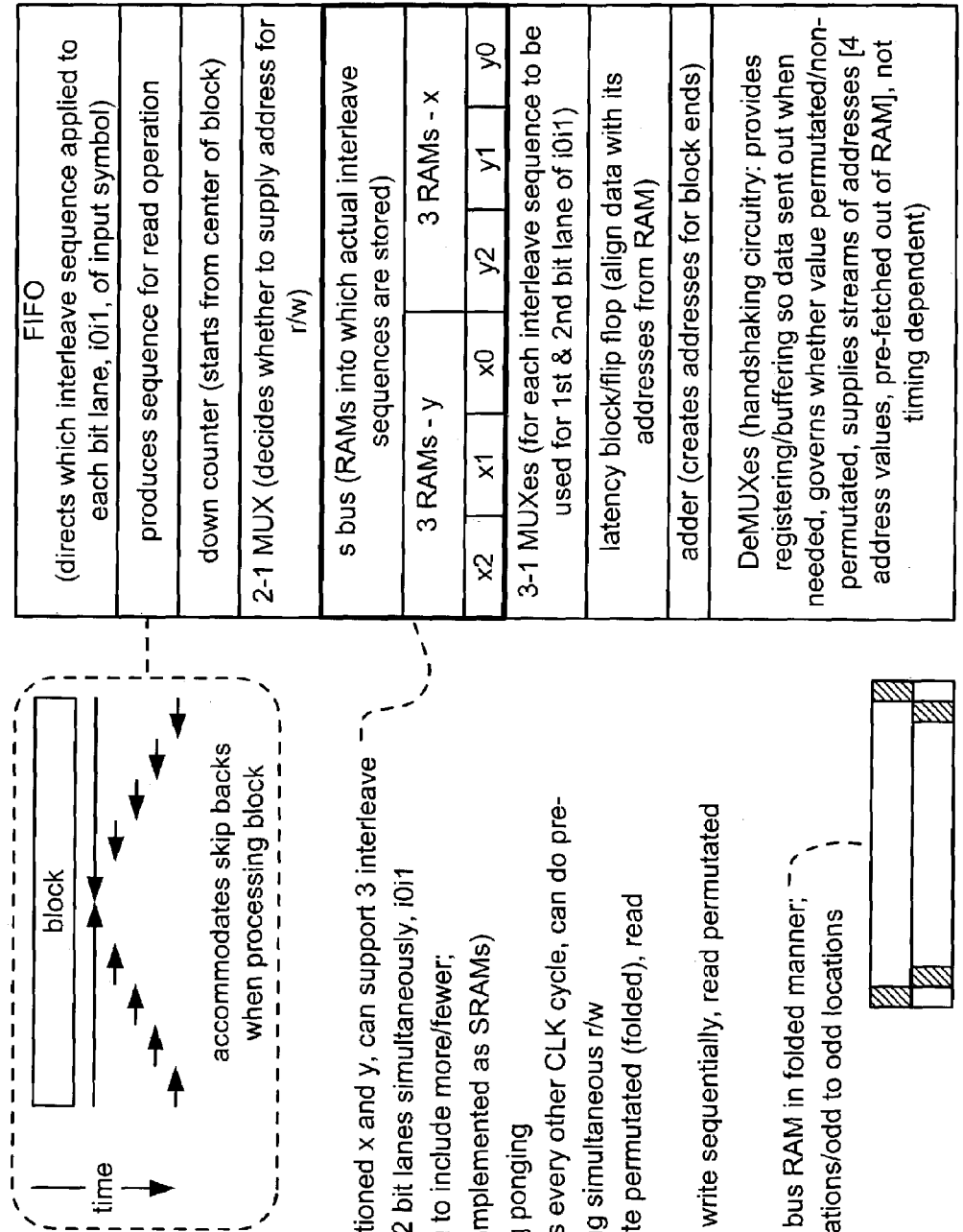
FIG. 20 is a diagram illustrating an embodiment of address generation for an interleaver/de-interleaver functional block according to the invention.

FIG. 20 is a diagram illustrating an embodiment of address generation for an interleaver/de-interleaver functional block according to the invention. This figure shows one possible implementation of how the address generation for the interleaver/de-interleaver may be achieved. The structure is adapted to accommodate the decoding of an encoded symbol having two bit lanes, which may be represented as $i_0 i_1$. Starting from the top of the figure, a FIFO is employed that directs which interleave sequence is to be applied to each bit lane of the input symbol. For example, the bit lane $i_0$ may be dealt with differently than the manner in which the bit lane $i_1$ for is dealt with. Below, a sequence generation portion produces the appropriate sequence that is to be employed for the read operation from the block; this includes also appropriately dealing with the skip-back processing that is performed according to the invention. Below this portion is a down counter that starts at the center of the block (the block middle) and counts down to zero because the data coming out of the SISO starts form the block middle; this need only be performed for one half of the block because the data is folded (half of the data is already being provided in the properly proceeding order). Below this portion is a 2 to 1 MUX that decides whether to supply the address for read or write (r/w); this 2 to 1 MUX is used to select the appropriate address that is generated for both the read and write (r/w) streams.

Central to this functional block is the s bus which is RAM that is logically partitioned into 6 different portions. The s bus includes 6 RAMs, partitioned into an x portion and a y portion that can simultaneously support 3 different interleave sequences for the 2 bit lanes, $i_0 i_1$. However, it is noted that the s bus may be logically partitioned (scaled) so as to accommodate more and/or fewer interleave sequences; the RAM may also be implemented as Synchronous RAMs without departing from the scope and spirit of the invention. The data may be written/read using even/odd ping ponging. The addresses may be pulled every other CLK cycle so as to enable pre-fetching which allows simultaneous r/with to the s bus. The interleave sequence involves writing the data in a permutated (folded) manner and performing reading of the data sequentially. The de-interleave sequence involves write the data in a sequential manner and read the data in a permutated (folded) manner as also described above in other embodiments.

Below the s bus are 2 separate 3 to 1 MUXes. Each 3 to 1 MUX is used for the respective interleave sequence of the $1^{st}$ and $2^{nd}$ bit lanes of the input symbol. Below the 3 to 1 MUXes is a latency block/flip flop that is operable to align the data with its addresses from RAM. An adder is located below the block/flip flop to crate the addresses for the block ends; this is to accommodate the folded manner in which the data is to be processed. Below the adder are two separate DeMUXes (de-multiplexors) that may accurately be characterized as being handshaking circuitry that operates to provide the necessary registering/buffering so that the data will be sent out when needed. The DeMUXes govern whether the value is to be provided in a permutated/non-permutated manner; the DeMUXes supply stream of addresses [4 address values, pre-fetched out of RAM] that may be provided in a manner that is not timing dependent.

Figure 21:
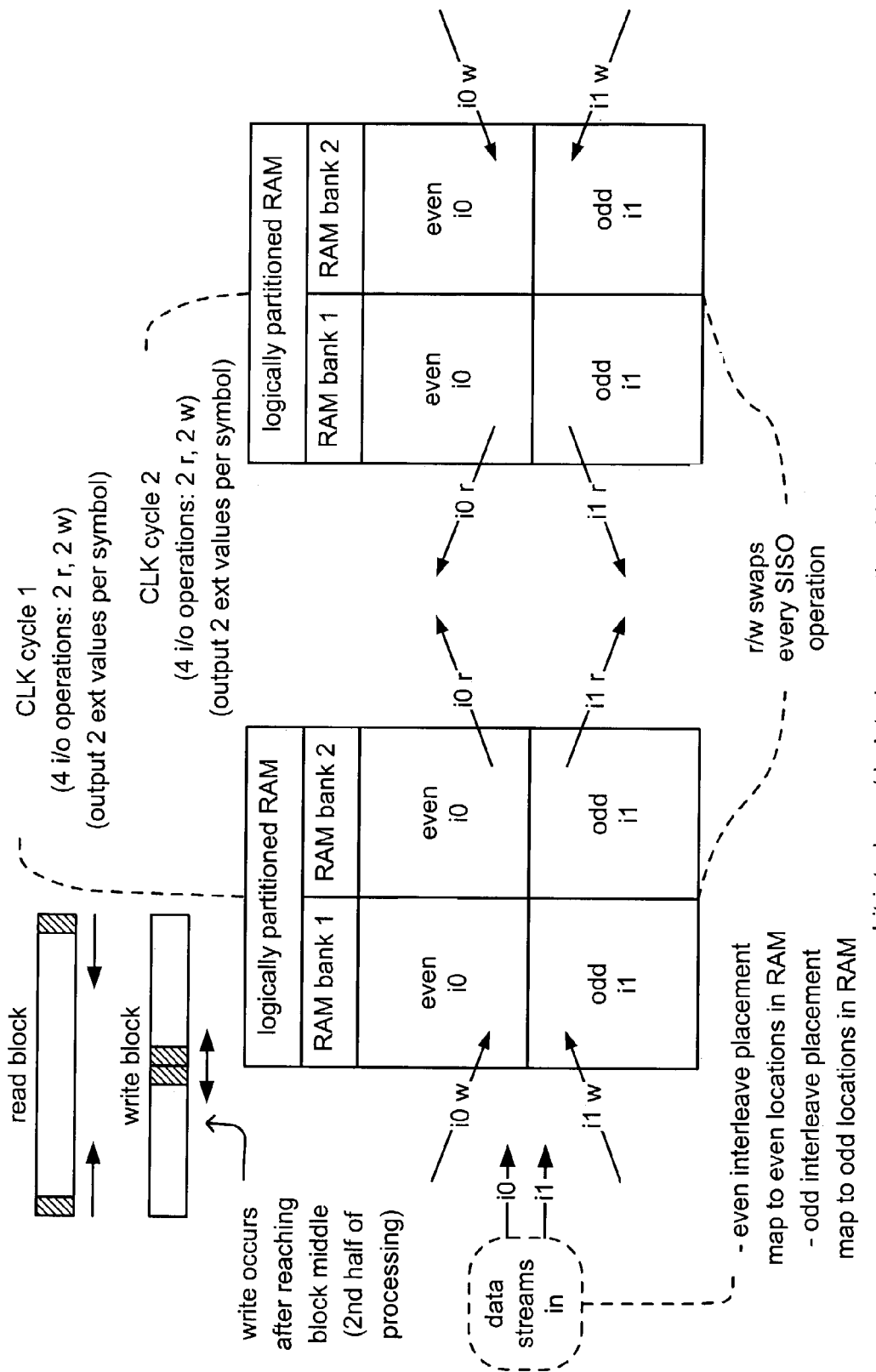
FIG. 21 is a diagram illustrating an embodiment of a bit interleave/de-interleave functional block according to the invention.

FIG. 21 is a diagram illustrating an embodiment of a bit interleave/de-interleave functional block according to the invention. The bit interleave/de-interleave functional block includes a logically partitioned RAM that includes a RAM bank 1 and a RAM bank 2; each of the RAM bank 1 and the RAM bank 2 is further divided into a top portion and into a bottom portion. The reading from the RAM occurs in a manner beginning from the ends of the block and proceeding towards the block middle, and the writing to the RAM occurs in a manner beginning from the block middle and proceeding to the ends of the block. The even interleave placements map to the even locations within the RAM, and the odd interleave placements map to the odd locations within the RAM. In addition, the reading/writing of the locations within this logically partitioned RAM is swapped every SISO operation.

To illustrate the operation of the bit interleave/de-interleave functional block, two separate clock cycles as shown. Looking at CLK cycle 1, 4 separate input/output (i/o) operations are performed (2 read/2 write) and 2 extrinsic values may be calculated there from. More specifically, the value associated with bit lane $i_0$ is written to the even location of the RAM bank 1, and the value associated with bit lane $i_1$ is written to the odd location of the RAM bank 1. Simultaneously, the previously calculated value associated with bit lane $i_0$ is read from the even location of the RAM bank 2, and the previously calculated value associated with bit lane $i_1$, is read from the odd location of the RAM bank 2.

In the next clock cycle, shown as a CLK cycle 2, 4 separate input/output (i/o) operations are performed (2 read/2 write) and 2 extrinsic values may be calculated there from. It is noted that the read/write portions are then swapped during this clock cycle. For example, the previously calculated value associated with bit lane $i_0$ is read from the even location of the RAM bank 1, and the previously calculated value associated with bit lane $i_1$ is read from the odd location of the RAM bank 1. Simultaneously, the value associated with bit lane $i_0$ is written to the even location of the RAM bank 2, and the value associated with bit lane $i_1$ is written to the odd location of the RAM bank 2.

Figure 22:
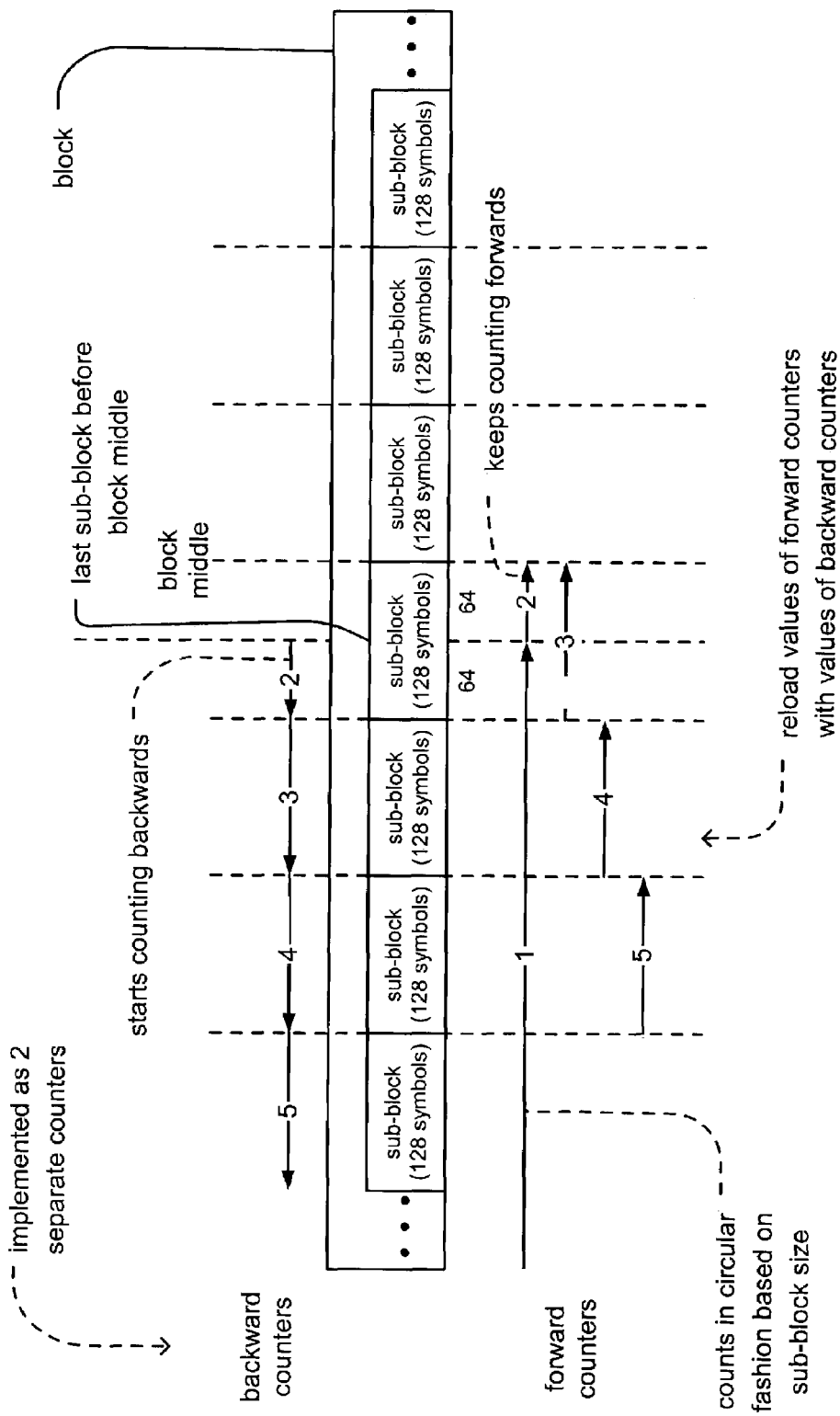
FIG. 22 is a diagram illustrating an embodiment of counter usage within block processing according to the invention (shown in a 128 symbol sub-block embodiment).

FIG. 22 is a diagram illustrating an embodiment of counter usage within block processing according to the invention (shown in a 128 symbol sub-block embodiment). For clarity of illustration, the use of the counters to support the processing of the invention is shown using only one side of the block. However, the functionality described herein is directly applicable to support the counting of the other half of the block as well.

Two separate counters are implemented to perform forward and backward counting when processing the received block according to the invention including supporting the skip-back processing described herein. Initially, forward counters are employed to count in a circular fashion, based on the sub-block size of the sub-blocks within the block, to accommodate and locate the times at which the check point values (being alpha check point values in this half); this period is shown as being 1. After reaching the sub-block that is located immediately to the left of the block middle, specifically when reaching the middle of this sub-block (half way through the 128 symbols of the sub-block, at symbol 64 within the sub-block), one counter will continue to count forward while a backward counter will then start counting backwards. This is to ensure that when the forward counter reaches the end of this sub-block, then the backward counter will reach the beginning of this sub-block as well.

The corresponding forward and backward counters operate cooperatively to ensure proper sequencing of the calculated alphas, betas, and extrinsic values that are calculated, selectively stored and retrieved, and (in some cases) re-calculated when performing the received block processing to decode the symbols contained therein. The values of the forward counters may be re-loaded with the values of the backward counters to ensure proper synchronization and indexing of the various symbols when performing the decoding of those symbols.

It is also noted that while this embodiment is shown as accommodating a symbol sequence length such that the sub-blocks are of length having 128 symbols each, the values employed with the counters herein may be modified to accommodate symbol sequence lengths of other lengths as well without departing from the scope and spirit of the invention. The use of the forward and backward counters, in cooperation with the re-loading of the values of the forward counters with the values of the backward counters, allows for the proper indexing of the symbols to support the processing of the received block according to the invention.

FIG. 23 is a flowchart illustrating an embodiment of a received block processing method that is performed according to the invention. By starting from ends of block, the method begins by processing symbols to calculate alphas and betas and store check point values as shown in a block 2310. Then, when the method continues processing and encounters the last sub-blocks that are located on each side of the block middle, the corresponding alpha and beta values are pushed onto stacks as shown in a block 2320. The method then performs sub-block skip-back processing towards the two block edges as shown in a block 2330. In doing so, the method re-calculates the alphas (and the betas) using the previously stored check point values for the preceding sub-blocks. For the current sub-block, the method simultaneously pops the corresponding betas (and the corresponding alphas) from stacks for use with the most recently calculated alphas in performing extrinsic calculation. The method then actually performs the extrinsic value calculations using these appropriate alphas and betas for each symbol within the block as shown in a block 2340.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
a first alpha/beta metric calculation functional block that initially processes encoded symbols of a plurality of encoded symbols in a first direction within a block, the first direction extending from a block beginning towards a block middle, to calculate forward metrics (alphas) and selectively stores alpha check point values associated with the sub-blocks of the plurality of sub-blocks that are processed in the first direction onto a check point stack, wherein the block includes a plurality of encoded symbols arranged into a plurality of sub-blocks;
wherein the first alpha/beta metric calculation functional block also initially processes the encoded symbols of the plurality of encoded symbols in a second direction within the block, the second direction extending from a block end towards the block middle, to calculate backward metrics (betas) and selectively stores beta check point values associated with the sub-blocks of the plurality of sub-blocks that are processed in the second direction;
wherein, when the first alpha/beta metric calculation functional block substantially reaches the block middle when processing in the first direction, the first alpha/beta metric calculation functional block pushes each alpha value onto an alpha stack;
wherein, when the first alpha/beta metric calculation functional block substantially reaches the block middle when processing in the second direction, the first alpha/beta metric calculation functional block pushes each beta value onto a beta stack;
wherein, when the first alpha/beta metric calculation functional block reaches the block middle after processing in the first direction, a second alpha/beta metric calculation functional block skips back to a first sub-block that has been processed in the first direction by the first alpha/beta metric calculation functional block and recalculates alphas for each encoded symbol contained in the first sub-block while the first alpha/beta metric calculation functional block simultaneously calculates betas in the second direction for a sub-block adjacent to the first sub-block;
wherein, when the first alpha/beta metric calculation functional block substantially reaches the block middle after processing in the second direction, the second alpha/beta metric calculation functional block skips back to a second sub-block that has been processed by the first alpha/beta metric calculation functional block in the second direction and re-calculates betas for each encoded symbol contained in the second sub-block while the first alpha/beta metric calculation functional block simultaneously calculates alphas in the first direction for a sub-block adjacent to the second sub-block;
for each encoded symbol for which the second alpha/beta metric calculation functional block calculates a beta in the second direction for the sub-block adjacent to the first sub-block, an extrinsic value calculation functional block pops a corresponding alpha off of the alpha stack and calculates a corresponding soft symbol decision using the most recently corresponding calculated beta and most recently popped alpha; and
for each encoded symbol for which the second alpha/beta metric calculation functional block calculates an alpha in the first direction for the sub-block adjacent to the second sub-block, the extrinsic value calculation functional block pops a corresponding beta off of the beta stack and calculates a corresponding soft symbol decision using the most recently corresponding calculated alpha and most recently popped beta.

2. The apparatus of claim 1, further comprising an output processor that selectively receives a first soft symbol decision there from that corresponds to first encoded symbol within the sub-block adjacent to the first sub-block and calculates a best estimate for the first encoded symbol using the first corresponding soft symbol decision; and
wherein the output processor selectively receives a second corresponding soft symbol decision that corresponds to a second encoded symbol within the sub-block adjacent to the second sub-block and calculates a best estimate for the second encoded symbol using the second corresponding soft symbol decision.

3. The apparatus of claim 1, wherein the plurality of encoded symbols is encoded according to a rate control sequence having a plurality of rate controls arranged in a period.

4. The apparatus of claim 3, wherein a rate control of the plurality of rate controls includes a modulation that includes a constellation having a mapping.

5. The apparatus of claim 3, wherein a first rate control of the plurality of rate controls includes a first modulation that includes a first constellation having a first mapping; and
wherein a second rate control of the plurality of rate controls includes a second modulation that includes a second constellation having a second mapping.

6. The apparatus of claim 3, wherein the first alpha/beta metric calculation functional block and the second alpha/beta metric calculation functional block of the apparatus are included in a soft-in soft-out functional block (SISO) that is communicatively coupled to a metric generator that calculates a plurality of metrics for each symbol of the plurality of encoded symbols and provides the plurality of metrics to the SISO; and the metric generator calculates the plurality of metrics for each symbol of the plurality of encoded symbols based on its rate control.

7. The apparatus of claim 1, wherein the second alpha/beta metric calculation functional block performs skip-back processing for each remaining sub-block within the plurality of sub-blocks to re-calculate the respective alphas and betas therein.

8. The apparatus of claim 1, wherein first alpha/beta metric calculation functional block and the second alpha/beta metric calculation functional block of the apparatus are included in a soft-in soft-out functional block (SISO) that perform a first SISO operation and a second SISO operation during at least one iteration of iterative decoding to generate the soft symbol decisions.

9. The apparatus of claim 8, wherein, during the first SISO operation, the SISO calculates a first plurality of extrinsic values;

further comprising an interleaver/de-interleaver, communicatively coupled to the SISO, that interleaves the first plurality of extrinsic values to generate a first "a priori probability" (app) information that is fed back to the SISO during the first SISO operation;

wherein, during the second SISO operation, the SISO calculates a second plurality of extrinsic values;

wherein the interleaver/de-interleaver de-interleaves the second plurality of extrinsic values to generate a second "a priori probability" (app) information that is fed back to the SISO during the second SISO operation.

10. The apparatus of claim 1, wherein:

the apparatus is a communication device; and the communication device is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

11. An apparatus, comprising:

a soft-in soft-out functional block (SISO) that, based on a plurality of metrics, calculates a first plurality of extrinsic values for each encoded symbol of the plurality of encoded symbols;

an interleaver/de-interleaver, communicatively coupled to the SISO, that interleaves the first plurality of extrinsic values to generate a first "a priori probability" (app) information;

wherein the SISO, based on the plurality of metrics, calculates a second plurality of extrinsic values for each encoded symbol of the plurality of encoded symbols;

wherein the interleaver/de-interleaver, that is communicatively coupled to the SISO, de-interleaves the second plurality of extrinsic values to generate a second "a priori probability" (app) information;

wherein the first "a priori probability" (app) information is fed back to the SISO during a first SISO operation;

wherein the second "a priori probability" (app) information is fed back to the SISO during a second SISO operation;

wherein the SISO performs the first SISO operation and the second SISO operation during at least one iteration of iterative decoding to generate a plurality of soft symbol decisions, each soft symbol decision of the plurality of soft symbol decisions corresponds to an encoded symbol of the plurality of encoded symbols;

wherein the SISO initially processes the encoded symbols of the plurality of encoded symbols in a first direction within a block, the first direction extending from a block beginning towards a block middle, to calculate forward metrics (alphas) and selectively stores alpha check point values associated with the sub-blocks of the plurality of sub-blocks that are processed in the first direction;

wherein the SISO also initially processes the encoded symbols of the plurality of encoded symbols in a second direction within the block, the second direction extending from a block end towards the block middle, to calculate backward metrics (betas) and selectively stores betas check point values associated with the sub-blocks of the plurality of sub-blocks that are processed in the second direction;

wherein, when the SISO substantially reaches the block middle when processing in the first direction and in the second direction, the SISO pushes each alpha value onto an alpha stack, and the SISO pushes each beta value onto a beta stack;

wherein, when the SISO reaches the block middle after processing in the first direction, the SISO skips back to a first sub-block that has been processed in the first direction and re-calculates alphas for each encoded symbol contained in the first sub-block while simultaneously continuing to calculate betas in the second direction for a sub-block adjacent to the first sub-block and popping alphas off of the alpha stack and calculating soft symbol decisions for each encoded symbol within the sub-block adjacent to the first sub-block; and wherein, when the SISO substantially reaches the block middle after processing in the second direction, the SISO skips back to a second sub-block that has been processed in the second direction and re-calculates betas for each encoded symbol contained in the second sub-block while simultaneously continuing to calculate alphas in the first direction for a sub-block adjacent to the second sub-block and popping betas off of the beta stack and calculating soft symbol decisions for each encoded symbol within the sub-block adjacent to the second sub-block.

12. The apparatus of claim 11, wherein the plurality of encoded symbols is encoded according to a rate control sequence having a plurality of rate controls arranged in a period.

13. The apparatus of claim 12, wherein the SISO is operable to calculate the soft symbol decisions for each encoded symbol within the sub-block adjacent to the first sub-block according to the respective rate control associated with each encoded symbol.

14. The apparatus of claim 12, wherein the SISO is operable to calculate the soft symbol decisions for each encoded symbol within the sub-block adjacent to the second sub-block according to the respective rate control associated with each encoded symbol.

15. The apparatus of claim 12, wherein a rate control of the plurality of rate controls includes a modulation that includes a constellation having a mapping.

16. The apparatus of claim 12, wherein:

a first rate control of the plurality of rate controls includes a first modulation that includes a first constellation having a first mapping; and a second rate control of the plurality of rate controls includes a second modulation that includes a second constellation having a second mapping.

17. The apparatus of claim 11, wherein the interleaver/de-interleaver includes logically partitioned Random Access Memory (RAM) to support simultaneous read/write operations to at least two logically partitioned portions of the RAM.

18. The apparatus of claim 11, wherein the SISO is operable to perform skip-back processing for each remaining sub-block within the plurality of sub-blocks.

19. The apparatus of claim 11, further comprising an output processor that is operable to receive the plurality of soft symbol decisions and generates hard symbol decisions there from that are best estimates of the encoded symbols of the plurality of encoded symbols.

20. The apparatus of claim 11, wherein:
the apparatus is a communication device; and
the communication device is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

21. A method, comprising:
processing the encoded symbols of the plurality of encoded symbols in a first direction within a block that includes a plurality of encoded symbols arranged into a plurality of sub-blocks, the first direction extending from a block beginning towards a block middle, to calculate forward metrics (alphas) and selectively storing alpha check point values associated with the sub-blocks of the plurality of sub-blocks that are processed in the first direction;
processing the encoded symbols of the plurality of encoded symbols in a second direction within the block, the second direction extending from a block end towards the block middle, to calculate backward metrics (betas) and selectively storing betas check point values associated with the sub-blocks of the plurality of sub-blocks that are processed in the second direction;
when reaching the block middle when processing in the first direction and in the second direction, storing each alpha value and each beta value;
when reaching the block middle after processing in the first direction, skipping back to a first sub-block that has been processed in the first direction and re-calculating alphas for each encoded symbol contained in the first sub-block while simultaneously continuing to calculate betas in the second direction for a sub-block adjacent to the first sub-block, retrieving the stored alphas, and calculating soft symbol decisions for each encoded symbol within the sub-block adjacent to the first sub-block; and
when reaching the block middle after processing in the second direction, skipping back to a second sub-block that has been processed in the second direction and re-calculating betas for each encoded symbol contained in the second sub-block while simultaneously continuing to calculate alphas in the first direction for a sub-block adjacent to the second sub-block, retrieving stored betas, and calculating soft symbol decisions for each encoded symbol within the sub-block adjacent to the second sub-block.

22. The method of claim 21, wherein the plurality of encoded symbols is encoded according to a rate control sequence having a plurality of rate controls arranged in a period.

23. The method of claim 22, further comprising calculating the soft symbol decisions for each encoded symbol within the sub-block adjacent to the first sub-block according to the respective rate control associated with each encoded symbol.

24. The method of claim 22, further comprising calculating the soft symbol decisions for each encoded symbol within the sub-block adjacent to the second sub-block according to the respective rate control associated with each encoded symbol.

25. The method of claim 22, wherein a rate control of the plurality of rate controls includes a modulation that includes a constellation having a mapping.

26. The method of claim 22, wherein:
a first rate control of the plurality of rate controls includes a first modulation that includes a first constellation having a first mapping; and
a second rate control of the plurality of rate controls includes a second modulation that includes a second constellation having a second mapping.

27. The method of claim 21, further comprising calculating two extrinsic values for an encoded symbol of the plurality of encoded symbols.

28. The method of claim 21, further comprising performing skip-back processing for each remaining sub-block within the plurality of sub-blocks.

29. The method of claim 21, further comprising:
calculating a soft symbol decision using an extrinsic value for an encoded symbol of the plurality of encoded symbols; and
generating a hard symbol decision using the soft symbol decision that is a best estimate of the encoded symbol of the plurality of encoded symbols.

30. The method of claim 21, wherein:
the method is performed within a communication device; and
the communication device is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

* * * * *

UNITED STATES PATENT AND TRADEMARK OFFICE
CERTIFICATE OF CORRECTION

| | | |
|---|---|---|
| PATENT NO. | : 7,107,512 B2 | Page 1 of 1 |
| APPLICATION NO. | : 10/444148 | |
| DATED | : September 12, 2006 | |
| INVENTOR(S) | : Kelly Cameron | |

It is certified that error appears in the above-identified patent and that said Letters Patent is hereby corrected as shown below:

Column 1, line 6-10: replace ' "The following U.S. Provisional Patent Applications is hereby incorporated herein by reference in their entirety and made part of the present U.S. Utility patent application for all purposes:" ' with --The present U.S. Utility Patent Application claims priority pursuant to 35 U.S.C. § 119(e) to the following U.S. Provisional Patent Applications which are hereby incorporated herein by reference in their entirety and made part of the present U.S. Utility Patent Application for all purposes:--

Column 1, line 17-18: delete "present U.S. Utility Patent Application also claims priority pursuant to 35 U.S.C. § 120 to the"

Column 1, line 19: after "application" delete "which"

Signed and Sealed this

First Day of July, 2008

JON W. DUDAS
*Director of the United States Patent and Trademark Office*